United States Patent [19]

Tran

[11] Patent Number: 5,040,139

[45] Date of Patent: Aug. 13, 1991

[54] TRANSMISSION GATE MULTIPLEXER (TGM) LOGIC CIRCUITS AND MULTIPLIER ARCHITECTURES

[76] Inventor: Dzung J. Tran, 7353 SE. Hacienda, Hillsboro, Oreg. 97123

[21] Appl. No.: 509,904

[22] Filed: Apr. 16, 1990

[51] Int. Cl.[5] .............................................. G06F 7/52
[52] U.S. Cl. ................................................ 364/760
[58] Field of Search ................ 364/760; 307/443, 448, 307/451, 579, 584, 585

[56] References Cited

U.S. PATENT DOCUMENTS

| | | | |
|---|---|---|---|
| 4,363,107 | 12/1982 | Ohhashi et al. | 364/758 |
| 4,536,855 | 8/1985 | Morton | 364/786 |
| 4,566,064 | 1/1986 | Whitaker | 364/300 |
| 4,710,649 | 12/1987 | Lewis | 307/451 |
| 4,813,008 | 3/1989 | Shigehara et al. | 364/760 |
| 4,817,029 | 3/1989 | Finegold | 364/760 |
| 4,825,401 | 4/1989 | Ikumi | 364/760 |
| 4,879,677 | 11/1989 | Shiraishi | 364/760 |

OTHER PUBLICATIONS

H. Hnatek, *User's Guidebook to Digital CMOS Circuits*, (McGraw-Hill 1981) pp. 34–41.
R. R. Shively et al., "Cascading Transmission Gates to Enhance Multiplier Performance,"*IEEE Transactions on Computers*, vol. C-33, No. 7, Jul., 1984.
K. Yano et al., "A 3.8 ns 16×16 Multiplier Using Complementary Pass Transistor Logic", IEEE 1989 Custom Integrated Circuits Conference.

*Primary Examiner*—Dale M. Shaw
*Assistant Examiner*—Tan V. Mai
*Attorney, Agent, or Firm*—Marger, Johnson, McCollom & Stolowitz, Inc.

[57] ABSTRACT

Transmission gate multiplexer circuits (FIG. 5) are used to form Booth select logic (FIG. 12), Booth recode multiplexer logic (FIG. 11), constant K-bit logic (FIG. 13) and reduced sign bit logic (FIG. 14). In these circuits, input variables are selectively applied both to multiplexer input terminals and to multiplexer select terminals, to achieve the desired logic functions with minimum delay.

4 Claims, 24 Drawing Sheets

TRANSMISSION GATE MULTIPLEXER (TGM) LOGIC CIRCUITS AND MULTIPLIER ARCHITECTURES

BACKGROUND OF THE INVENTION

The present invention relates to digital integrated circuits for implementing logic functions and, more particularly, to a binary multiplier circuit comprising subcircuits all of which are implemented using exclusively transmission gate multiplexer (TGM) circuits.

Every designer and manufacturer of integrated circuits currently faces two formidable obstacles to performance improvements. First, further increases in circuit density require design and implementation of submicron feature size devices. This effort requires vast investments of resources in new equipment and techniques. Second, even assuming success in building submicron devices, operation of circuits with transistor gate lengths substantially smaller than one micron is limited by breakdown voltages less than the five volt supply voltage level now standard for virtually all logic devices throughout the industry. Lower supply voltages compromise noise immunity and are incompatible with existing components and systems. Substantial investment in research, development and implementation of new processes and materials is being made in an attempt to overcome these limitations.

Such changes are likely to come about relatively slowly. In the interim, improved performance must be achieved by improved designs using existing technologies.

Several families of integrated circuits are known for implementing a wide variety of logic functions. Logic families include the various forms of TTL, ECL, MOS, CMOS and the like. These various logic families offer the logic circuit designer the ability to trade off speed, size, power consumption, noise immunity and other considerations by selecting a logic family accordingly. Tradeoffs must be made as no single logic family to date is an outstanding performer in all of these categories.

Improvements in performance of some kinds of logic circuits have been achieved through the use of pass transistors or transmission gate structures. A transmission gate multiplexer offers speed and area characteristics superior to known logic circuit designs.

However, design of logic circuits using such technologies, particularly design of higher order logic functions (for example, functions of greater than three variables) remains a challenge.

U.S. Pat. No. 4,710,649 (Lewis) discloses transmission gate logic circuits for implementing fundamental boolean combinations such as AND and OR functions. The '649 patent shows simplified or reduced versions of two and three input AND and OR gates for reducing transistor count, and suggests cascading additional stages to form a circuitry for implementing higher order functions. When extended to higher order boolean functions however, the resultant circuits are not optimal. (See the discussion of FIG. 3, below.)

U.S. Pat. No. 4,566,064 (Whitaker) presents a design methodology for constructing circuits using pass transistors to implement logic functions. The method disclosed in the '064 patent, however, has several drawbacks. A substantial propagation delay results from connecting more than two transmission gate outputs in parallel. This results in larger output parasitic capacitants, a major contributor to delay in CMOS designs. For a large number of inputs, the number of required circuit elements, such as transmission gates, increases geometrically with the number of input variables. Finally, circuits designed as described in the '064 patent are difficult to simulate on existing gate-level simulation programs because two or more transmission gate output terminals can be ON in parallel, thus requiring the simulator software to resolve this apparent driver conflict by applying varied signal strengths.

A basic primer on CMOS transmission gates and their use is E. Hnatek, USER'S GUIDEBOOK TO DIGITAL CMOS INTEGRATED CIRCUITS (McGraw-Hill 1981) pp. 34–41. A combinational multiplier circuit that includes the use of transmission gates in an adder cell is shown in R. R. Shively, et al. "Cascading Transmission Gates to Enhance Multiplier Performance" IEEE Transactions on Computers, Vol. c-33, No. 7, July, 1984. Pass transistor logic is used in "A 3.8 ns 16×16 Multiplier Using Complementary Pass Transistor Logic," by K. Yano, et al, IEEE 1989 Custom Integrated Circuits Conference. The problem of digital signal propagation delay through a string of pass transistors is recognized, and a solution suggested, in U.S. Pat. No. 4,536,855 (Morton). An MOS binary multiplication cell circuit with reduced transistor count is shown in U.S. Pat. No. 4,363,107 (Ohhashi et al.).

Accordingly, the need remains for better designs of TGM logic circuits to gain improvements in speed and performance over the state of the art.

SUMMARY OF THE INVENTION

I have discovered that a transmission gate multiplexer (TGM) is a very useful building block for constructing logic circuits having size, speed and power characteristics superior to those of known circuits for implementing the same logic functions. TGM circuits, i.e. transmission gates and inverters, can be used to implement all of the various logic functions necessary to construct a binary multiplier and multiplier accumulator. These circuits include, for example, a Booth recoder, Booth multiplexer, half-adder, full-adder, etc, all of which are described below.

I have found that improved performance of a multiplier or multiplier accumulator can be achieved by implementing the whole design based on a set of novel transmission gates and inverter logic circuit designs that I have invented. Note that such designs do not include conventional logic gates such as AND, NAND, OR, NOR, XOR, XNOR. The performance of the design is improved because the delay of a transmission gate is about "⅓" that of "regular" logic such as conventional CMOS circuits.

The foregoing and other objects, features and advantages of the invention will become more readily apparent from the following detailed description of a preferred embodiment which proceeds with reference to the drawings.

BRIEF DESCRIPTION OF THE TABLES

TABLE 1 is a device count comparison between an AND-OR-INVERT logic circuit according to the present invention and two alternative circuits.

TABLE 2 is a truth table for a transmission gate multiplexer (TGM) circuit.

TABLE 3 is a Booth Recode Multiplexer Truth Table.

TABLE 4 is a Booth Select Logic Truth Table.

TABLE 5 is an Extra Bits Truth Table.

DETAILED DESCRIPTION OF A PREFERRED EMBODIMENT

Introduction

Figure 1:
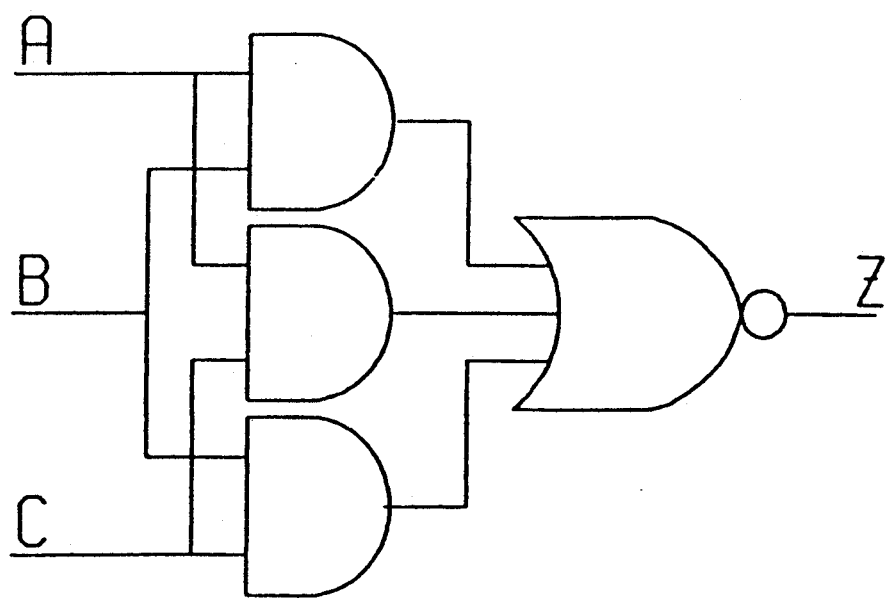
FIG. 1 is a symbolic logic diagram of an AND-OR-INVERT function of three input variables.
Figure 2:
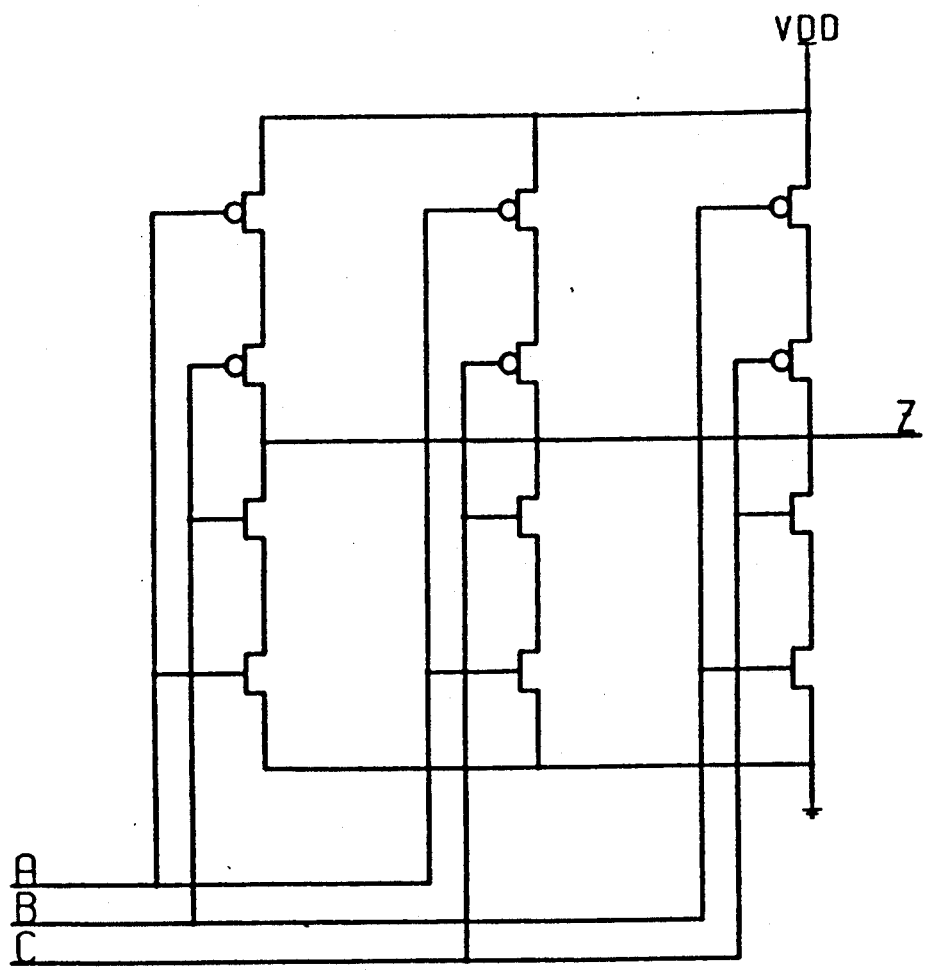
FIG. 2 is a conventional CMOS logic implementation of the logic junction of FIG. 1.

The general characteristics and advantages of TGM circuits are best illustrated by an example, as follows. FIG. 1 is a symbolic logic representation of an AND-OR INVERT function of three input variables A, B, and C. A conventional CMOS implementation of the logic function of FIG. 1 is shown in FIG. 2.

Figure 3:
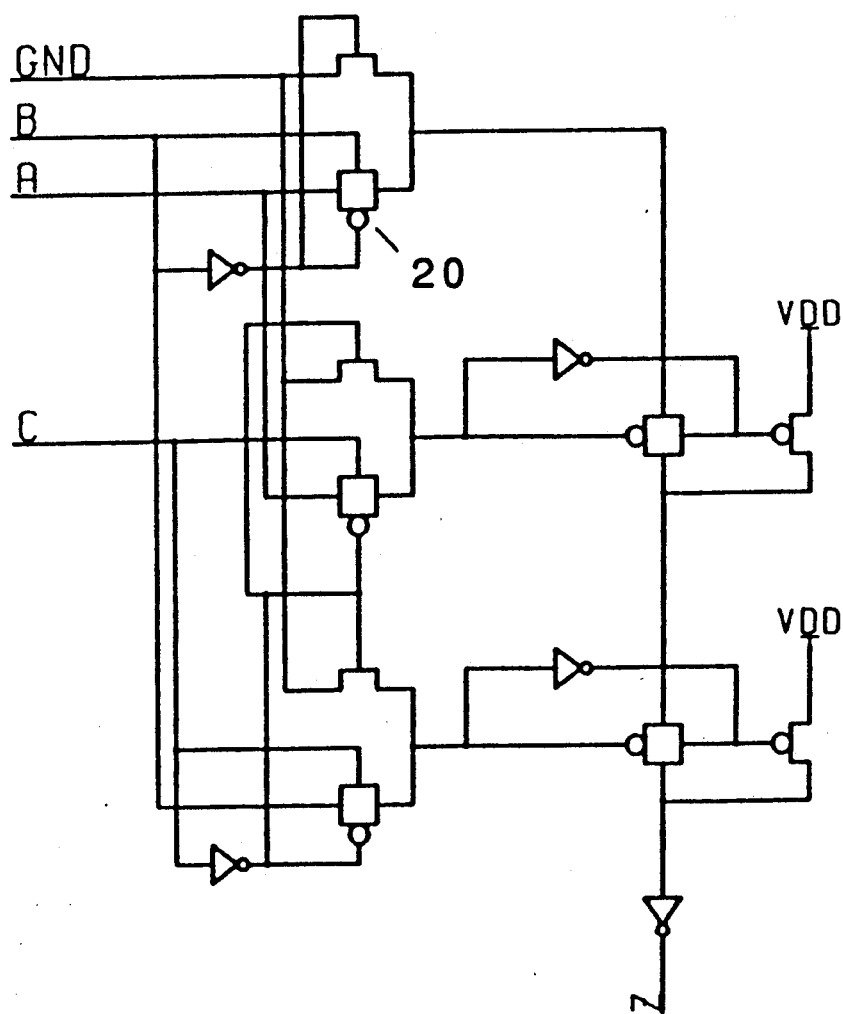
FIG. 3 is a transmission gate logic implementation of the logic junction of FIG. 1.

Another implementation of the logic function of FIG. 1 is shown in FIG. 3. FIG. 3 shows my design of an A-O-I circuit employing transmission gate elements, such as transmission gate 20, in accordance with the principles disclosed in U.S. Pat. No. 4,710,649 (Lewis).

Figure 4A:
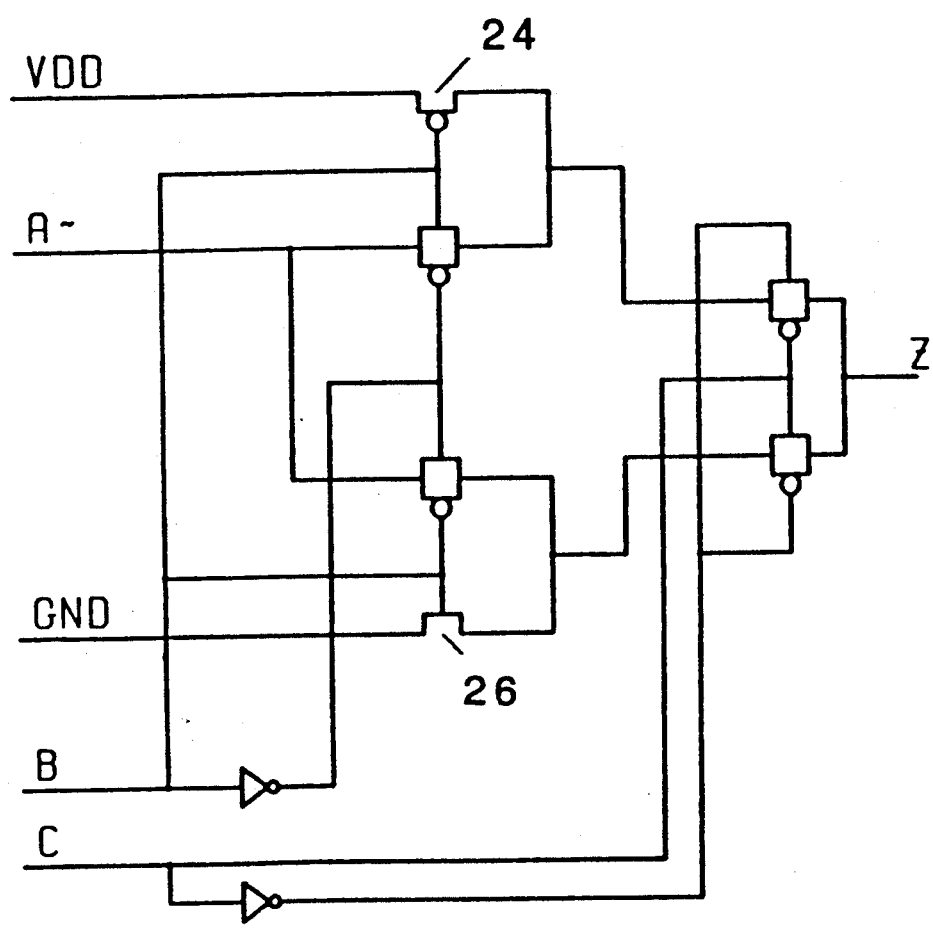
FIG. 4A is a transmission gate multiplexer (TGM) logic implementation of the logic function of FIG. 1 in accordance with the present invention.

FIG. 4A is a transmission gate multiplexer (TGM) circuit for implementing the logic function of FIG. 1 in accordance with the present invention. The transmission gate multiplexer (TGM) is further described below. The numbers of devices in aforementioned circuits are shown in Table 1:

TABLE 1

| DEVICE COUNT COMPARISON | | |
|---|---|---|
| FIG. Number | Transistors | Inverters |
| 2 | 12 | none |
| 3 | 15 | 7 |
| 4 | 10 | 2 |

Figure 4B:
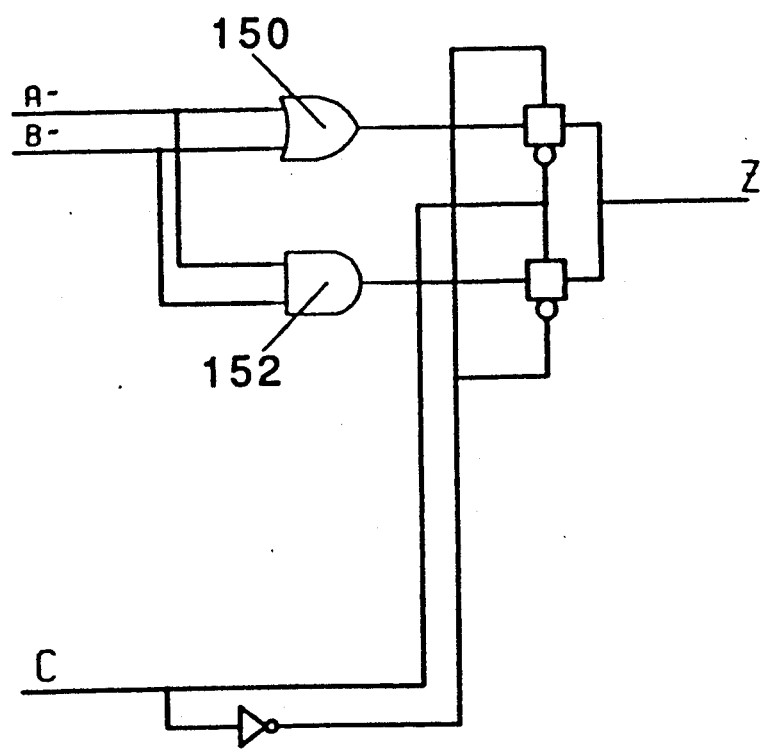
FIG. 4B is an alternative TGM implementation of the logic function of FIG. 1.

The delay times for the circuits shown in FIGS. 2–4 are $1\frac{2}{3}$, $2\frac{2}{3}$, and $1\frac{1}{3}$, respectively, expressed in NAND delay units. The transistor count and delay time for the novel circuit of FIG. 4A thus is less than either of the two known designs. Although the difference over conventional logic is not large in this simple example, the difference grows much larger for more complex circuits.

Transmission Gate Multiplexer (TGM)

Figure 5:
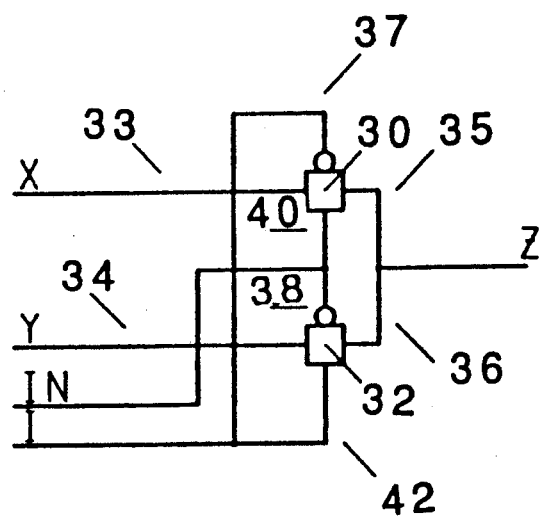
FIG. 5 is a schematic diagram of a transmission gate multiplexer (TGM).

FIG. 5 shows a pair of transmission gates 30,32 interconnected to form a transmission gate multiplexer (TGM). Each transmission gate is preferably formed by a pair of complementary PMOS and NMOS transistors having their respective sources and drains coupled together. Each of the transmission gates 30,32 includes, respectively, an input terminal 33,34 and an output terminal 35,36. A first input signal X is connected to the input terminal 33 of gate 30 and a second input signal Y is connected to the input terminal 34 of gate 32. The output terminals of the two transmission gates are coupled together to provide an output logic signal Z.

Each of the transmission gates 30,32 also includes first control terminals 37,38 and second (inverted) control terminals 40,42 respectively. Control terminals 37 and 42 are connected together to receive a single-bit binary variable or control logic signal I. Control terminals 40 and 38 are connected together to receive an inverted control signal IN, the complement of logic signal I. In operation, only one of the gates is enabled to transmit the signal at its input to the output at any one time. When I is high, gate 32 transmits input signal Y to the output Z and gate 30 is off. Conversely, when the control signal I is low, gate 30 transmits the input signal X to the output Z and gate 32 is off. The circuit of FIG. 5 thus provides a conventional multiplexer function, though it has the advantage afforded by the use of transmission gates, namely very short delay from input to output. The truth table for the transmission gate MUX circuit of FIG. 5 is shown below in Table 2.

TABLE 2

| TRUTH TABLE FOR TRANSMISSION GATE MUX (TGM) | | | | |
|---|---|---|---|---|
| I | IN | X | Y | Z |
| 1 | 0 | d | 1 | 1 |
| 1 | 0 | d | 0 | 0 |
| 0 | 1 | 1 | d | 1 |

TABLE 2-continued

TRUTH TABLE FOR TRANSMISSION GATE MUX (TGM)

| I | IN | X | Y | Z |
|---|----|---|---|---|
| 0 | 1  | 0 | d | 0 |

Where d = don't care

TGM Binary Tree structures

Improved logic circuit designs may be synthesized by interconnecting a plurality of TGMs to form TGM binary tree structures. A one-stage TGM tree structure is defined as a TGM having one of the inputs connected to $V_{dd}$ and the other input connected to ground. The select inputs to the TGM are connected to an input variable (and its complement). To implement a single variable logic function thus would require only one TGM.

Figure 6:
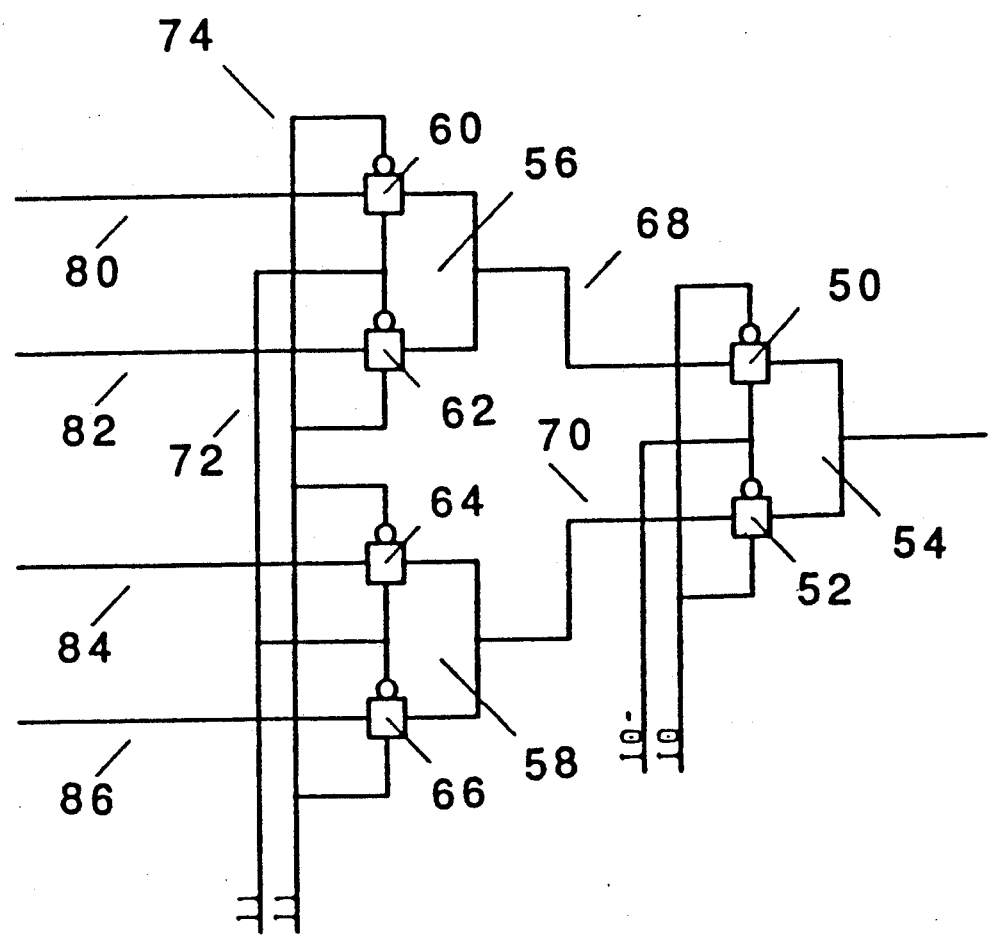
FIG. 6 is a schematic diagram of a two-stage TGM binary tree structure.

A two-input variable logic function is implemented in a two-stage TGM tree structure such as that shown in FIG. 6. Referring to the right side of the figure, transmission gates 50,52 are interconnected as described above to form a first TGM 54. This first TGM forms the first stage of the two-stage TGM tree structure. Input variable logic signal $I_0$ and its complement $I_0'$ are coupled to the select inputs to control the first stage TGM. Input logic signal $I_0$ is selected to be the least significant input variable.

Referring to the left side of FIG. 6, gates 60 and 62 are interconnected to form a second TGM 56 and gates 64 and 66 similarly are interconnected to form a third TGM 58. The output of the second TGM is connected along path 68 to the input terminal to gate 50. Similarly, the output of the third TGM is connected along path 70 to the input to gate 52. The second and third TGMs form the second stage, in this case the final stage, of the TGM tree structure.

Input logic signal $I_0$ and its complement $I_0'$ are coupled to control the first stage TGM 54. Input logic signal $I_1$ and its complement $I_1'$ are connected along paths 74,72 respectively to control the second and third TGMs. Input logic signal $I_1$ is the most significant input variable, and $I_0$ is the least significant input variable. The resulting two-stage TGM tree structure has four input terminals 80, 82, 84 and 86, corresponding to the input terminals to the four gates that make up the final stage. The two-stage TGM tree structure thus functionally resembles a 4:1 multiplexer.

In general, any predetermined boolean function of any number of input variables can be synthesized using a TGM tree structure. In operation of the logic circuit, the logic states of the input variables control the TGM circuits to route a logic signal to the output terminal in accordance with the desired boolean function.

The number of stages of a TGM tree structure as above-described increases in direct proportion to the number of input variables. As a result, the number of devices, and hence the area of the circuit, increases geometrically. No binary tree structure should be allowed to grow beyond four stages, due to TGM delay and size considerations. Accordingly, the number of stages and devices are reduced in the following specific circuits.

The foregoing principles and characteristics of transmission gate multiplexer (TGM) logic are applied to the design of an improved 32-bit multiplier and a multiplier-accumulator as further described below. These improved circuits are constructed exclusively of TGM logic circuits. Each of the sub-circuits used to build the multiplier and multiplier-accumulator are described in turn.

TGM Full Adder

Figure 7:
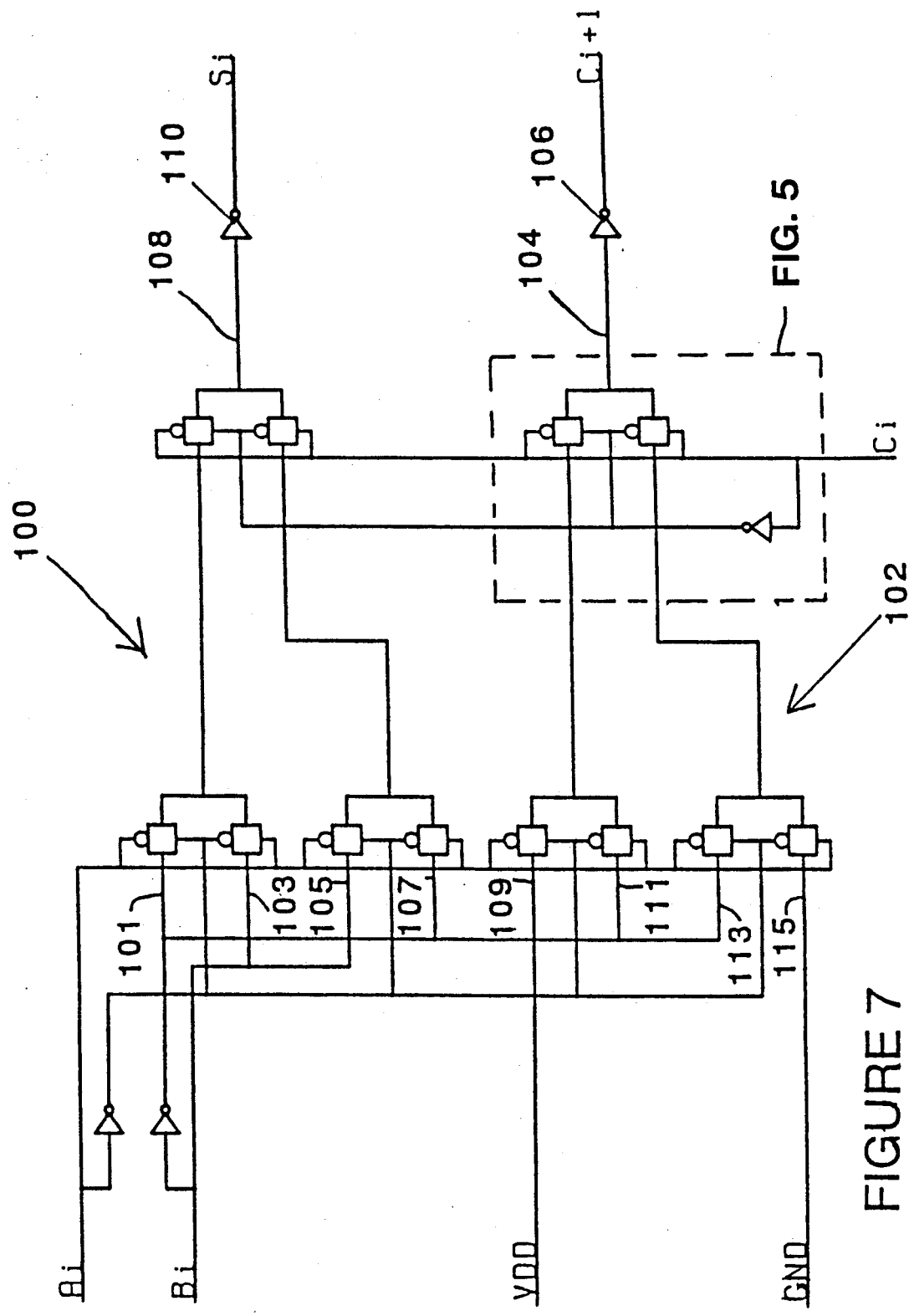
FIG. 7 is a full adder circuit implemented in TGM logic.

FIG. 7 is a schematic diagram of a transmission gate multiplexer (TGM) full adder circuit for combining operand bits $A_i$ and $B_i$ and a carry-in bit $C_i$ to provide a carry-out signal $C_{i+1}$ and a sum signal $S_i$. The circuit generally comprises a first two-stage TGM binary tree circuit 100 for providing the sum signal $S_i$ and a second two-stage TGM binary tree circuit 102 for providing the carry-out signal $C_{i+1}$.

Each TGM binary tree circuit 100,102 has four input terminals. In both circuits 100,102 the first stage control terminals are coupled to $C_i$ and the second stage control terminals are coupled to $A_i$.

In circuit 102, the input terminals 109 is coupled to receive a logic high signal $V_{dd}$; the input terminals 111,113 are coupled to receive a complement of the second operand bit $B_i^*$; and the input terminal 115 is coupled to receive a logic low signal. The output terminal 104 provides a complement of the carry-out bit $C_{i+1}^*$. In operation, one of said logic high, logic low and second operand bit input signals is routed to the output terminal 104 in accordance with the state of the first operand bit and the carry-in signal. An inverter 106 provides the final output signal $C_{i+1}$.

In the second two-stage TGM binary tree circuit 100, the input terminals 101,107 are coupled to receive a complement of the second operand bit $B_i^*$ and the input terminals 103,105 are coupled to receive the second operand bit $B_i$. In operation, one of said input signals is routed to the output terminal 108 in accordance with the state of the first bit and the carry-in signal to provide a complement of the sum signal $S_i^*$. An inverter 110 provides the final sum output signal $S_i$.

TGM Half Adder

Figure 8:
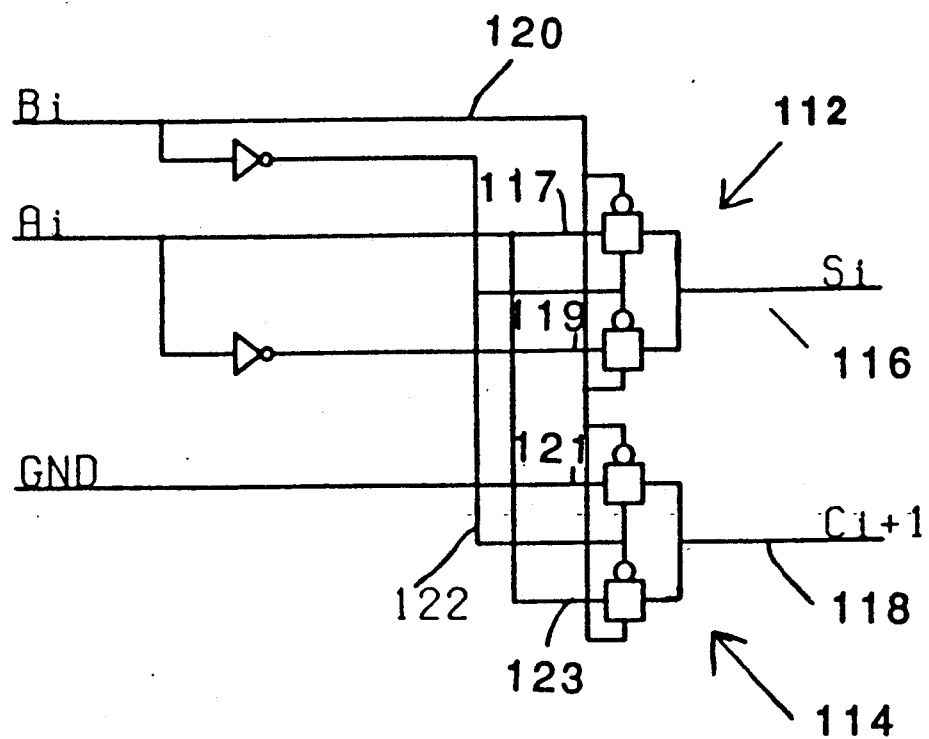
FIG. 8 is a schematic diagram of a half adder circuit implemented in TGM logic.

FIG. 8 is a schematic diagram of a transmission gate multiplexer (TGM) half adder circuit for combining operand bits $A_i$ and $B_i$ to form a sum output signal $S_i$ and a carry output signal $C_{i+1}$. The circuit generally comprises a sum TGM circuit 112 and a carry TGM circuit 114. Each TGM has an output terminal 116,118, a pair of control terminals 120,122 and two input terminals 117,119. The control terminals of the two TGMs 112,114 are connected in common to the second operand bit and its complement $B_i$ and $B_i^*$.

The sum TGM input terminal 117 is coupled to receive the first operand bit $A_i$; the sum TGM input terminal 119 is coupled to receive a complement of the first bit $A_i^*$; and the sum TGM output terminal 116 provides the sum output $S_i$ signal.

In the second or carry TGM 114, the input terminal 121 is coupled to receive a logic LOW signal; the input terminal 123 is coupled to receive the first operand bit $A_i$; and, the output terminal 118 provides the carry output $C_{1+1}$ signal.

Single-Input TGM Circuit

Figure 9A:
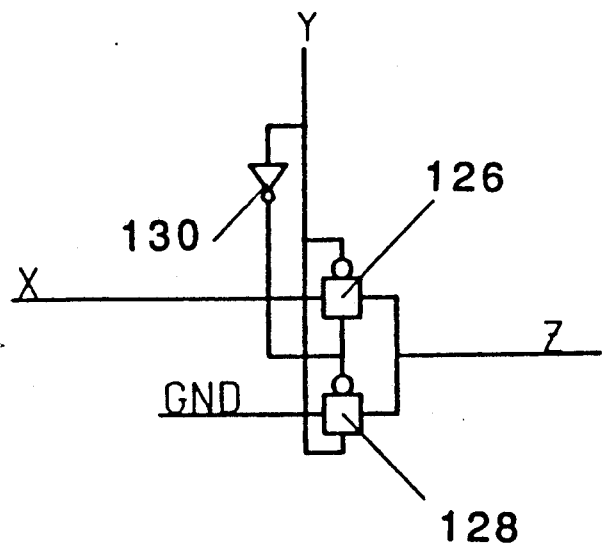
FIG. 9A is a schematic diagram of a single-input transmission gate multiplexer (TGM).
Figure 9B:
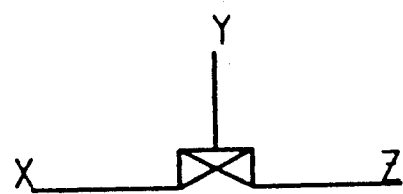
FIG. 9B is a simplified symbol representing the single-input TGM of FIG. 9A.

FIG. 9A is a schematic diagram of a TGM circuit arranged in a single-input configuration. The circuit includes transmission gates 126, 128 and an inverter 130. The input terminal is X, the output terminal is Z and the control terminal is Y. In operation, when Y is low, output Z is low. When Y is high, output Z has the same logic state as input X. FIG. 9B is a logic symbol that represents the circuit of FIG. 9A. This circuit is used extensively in the circuit of FIG. 10, described next.

Look Ahead Adder Circuit

Figure 10:
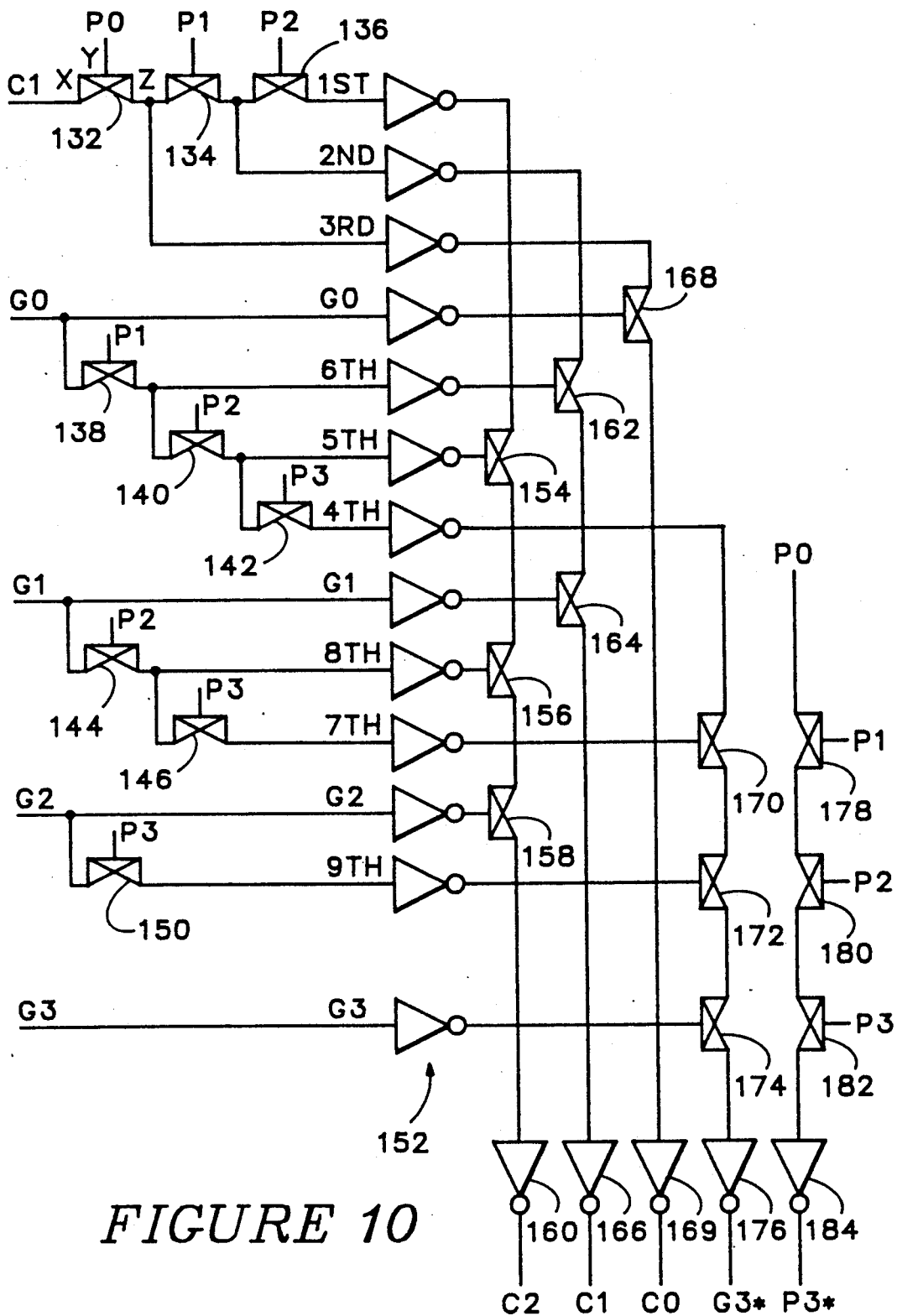
FIG. 10 is a schematic diagram of a 4-bit carry look-ahead (CLA) circuit implemented in transmission gate logic.

FIG. 10 is a schematic diagram of a transmission gate multiplexer (TGM) 4-bit look ahead adder circuit. The equations below show the function of the block look ahead adder:

$$C_0 = \overline{G_0 \cdot (P_0 \cdot C_i)}$$

$$C_1 = \overline{G_1 \cdot (P_1 \cdot G_0) \cdot (P_1 P_0 C_i)}$$

$$C_2 = \overline{G_2 \cdot (P_2 \cdot G_1) \cdot (P_2 P_1 G_0)(P_2 P_1 P_0 C_i)}$$

$$G_3^* = \overline{G_3 \cdot (P_3 G_2)(P_3 P_2 G_1)(P_3 P_2 P_1 G_0)}$$

$$P_3^* = \overline{P_3 P_2 P_1 P_0}$$

The input signals provided to the circuit of FIG. 10 are derived as follows:

| | |
|---|---|
| Propagate (Half Adder) | $P_n = A_n$ XOR $B_n$ |
| Generate (Half Adder) | $G_n = A_n B_n$ |

The half adder is shown in FIG. 8 and described above. The full adder is shown in FIG. 7, also described above.

To implement these logic functions, the circuit comprises a first series of three single-input TGM circuits 132,134,136 connected in series. These TGM circuits have Y control terminals coupled to propagate signals P0, P1 and P2 respectively. TGM 132 input terminal X is coupled to receive a carry-in signal $C_{in}$. This arrangement forms a first intermediate signal (P2 P1 P0 $C_{in}$), a second intermediate signal (P1 P0 $C_{in}$), and a third intermediate signal (P0 $C_{in}$).

The circuit of FIG. 10 further includes a second series of three single-input TGM circuits 138,140,142. These TGM circuits have Y control terminals coupled to propagate signals P1, P2 and P3 respectively. TGM 138 has an X input terminal coupled to receive the generate signal G0. This arrangement provides a fourth intermediate signal (P3 P2 P1 G0), a fifth intermediate signal (P2 P1 G0) and a sixth intermediate signal (P1 G0).

The circuit of FIG. 10 further includes a pair of single-input TGM circuits 144,146 connected in series, the TGM circuits having Y control input terminals coupled to propagate signals P2 and P3, respectively. TGM 144 has an X input terminal coupled to generate signal G1. This arrangement forms a seventh intermediate signal (P3 P2 G1) and an eighth intermediate signal (P2 G1).

The circuit of FIG. 10 also includes a single-input TGM circuit 150 arranged as shown to provide a ninth intermediate logic signal (P3 G2). TGM circuit 150 has a Y control terminal coupled to propagate signal P3 and an X input terminal coupled to generate input signal G2 to form the ninth intermediate signal (P3 G2). A single-input TGM circuit 168 has its Y control terminal coupled to the inverted generate signal G0*, its X input terminal coupled to (P0Ci)* and an output through inverter 169 to produce carry signal $C_0$.

Additionally, a series of 13 inverters 152 are provided as shown to invert each of the nine intermediate logic signals described above as well as the four generate input signals G0–G3.

Another aspect of the circuit of FIG. 10 is a third series of three single-input TGM circuits 154,156,158. These circuits have Y control terminals coupled to receive the inverted fifth intermediate signal (P2 P1 G0)*, the inverted eighth intermediate signal (P2 G1)* and the inverted generate signal G2*, respectively. The Z output signal from TGM 158 passes through an inverter 160 to form a carry signal C2.

Another pair of single-input TGM circuits 162,164 has Y control terminals coupled to receive the inverted sixth intermediate signal (P1 G0)* and the inverted generate signal G1*, respectively. The Z output signal from TGM 164 passes through an inverter 166 to form carry signal C1.

Referring further to the circuit of FIG. 10, a fourth set of three single-input TGM circuits 170,172,174 are connected in series. These fourth series TGMs have Y control terminals coupled to the inverted seventh intermediate signal (P3 P2 G1)*, the inverted ninth intermediate signal (P3 G2)* and the inverted generate signal G3*, respectively. TGM 170 of the fourth series has an X input terminal coupled to the inverted fourth intermediate signal (P3 P2 P1 G0)*. The Z output of TGM 174 passes through an inverter 176 to form an inverted generate signal G3*.

Booth Select Logic and Booth Recode Mux

Figure 11:
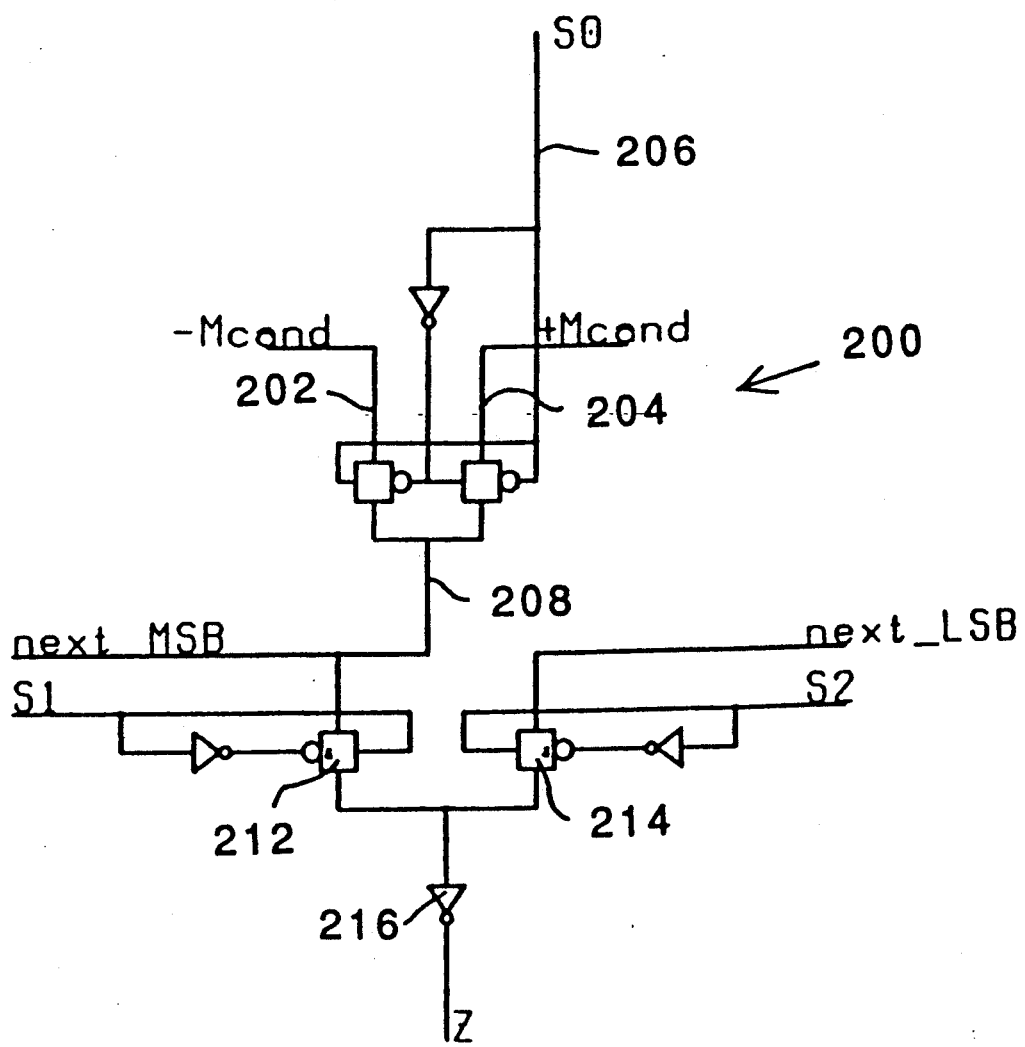
FIG. 11 is a schematic diagram of Booth recode circuit implemented in transmission gate logic.

Referring now to FIG. 11, a transmission gate multiplexer (TGM) Booth recode multiplexer (mux) circuit is shown. The Booth recode mux is based upon Table 3:

TABLE 3

| Booth Recode Multiplexer Truth Table | | | |
|---|---|---|---|
| S0 | S1 | S2 | Z |
| X | 0 | 0 | 1 |
| 0 | 1 | 0 | − Mcand |
| 1 | 1 | 0 | + Mcand |
| 0 | 0 | 1 | −2 Mcand |
| 1 | 0 | 1 | +2 Mcand |

The recode mux circuit of FIG. 11 includes a TGM circuit 200 having a first input terminal 202 coupled to receive the −Mcand bit, a second input terminal 204 coupled to receive the +Mcand bit, a control terminal 206 coupled to receive the S0 select bit and an output terminal 208 for providing an output signal.

A first transmission gate switch 212 is coupled to the output terminal 208 of TGM circuit 200 and is responsive to the S1 select bit. A second transmission gate switch 214 is coupled to receive the next least significant bit (LSB) and is responsive to the S2 select bit. An inverter 216 is connected to a common output node 215 to provide the Z result bit in accordance with the table, above. A pull-down resistor 217 also is connected to the node 215.

Figure 12:
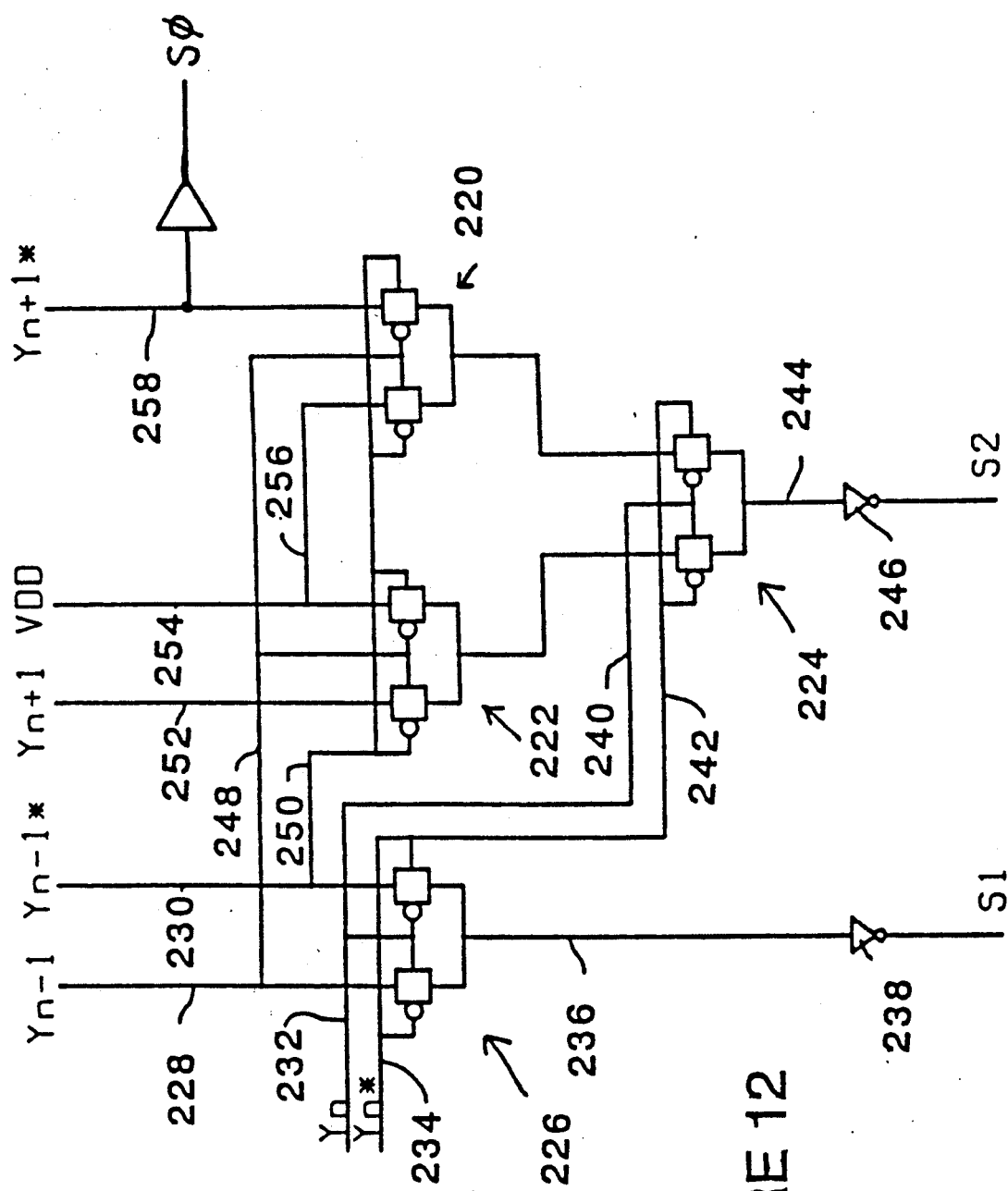
FIG. 12 is a schematic diagram of Booth select circuit implemented in transmission gate logic.

FIG. 12 is a schematic diagram of a transmission gate multiplexer (TGM) Booth select circuit for combining a series of three operand bits, $Y_{n-1}$ $Y_n$ and $Y_{n+1}$ to form Booth recoded select bits S0, S1 and S2. The implementation for Booth's select logic is based on the following truth table and the equations following the Table 4:

TABLE 4

Booth Select Logic Truth Table

| Recoding | | | Recode | Select logic | | |
|---|---|---|---|---|---|---|
| $Y_{n+1}$ | $Y_n$ | $Y_{n-1}$ | Value | S0 | S1 | S2 |
| 0 | 0 | 0 | 0 | X | 0 | 0 |
| 0 | 0 | 1 | + Mcand | 1 | 1 | 0 |
| 0 | 1 | 0 | + Mcand | 1 | 1 | 0 |
| 0 | 1 | 1 | −2 Mcand | 1 | 0 | 1 |
| 1 | 0 | 0 | −2 Mcand | 0 | 0 | 1 |
| 1 | 0 | 1 | − Mcand | 0 | 1 | 0 |
| 1 | 1 | 0 | − Mcand | 0 | 1 | 0 |
| 1 | 1 | 1 | 0 | X | 0 | 0 |

Equations $$S0 = \overline{Y_{n+1}}$$

$$S1 = Y_n XOR Y_{n-1}$$

$$S2 = \overline{Y_{n+1}} Y_n Y_{n-1} + Y_{n+1} \overline{Y_n Y_{n-1}}$$

To implement the foregoing logic functions, the Booth select logic of FIG. 12 includes a two-stage TGM binary tree structure in which the first stage comprises a TGM 224 and the second stage includes TGMs 220 and 222. The two-stage TGM tree provides the second Booth recode bit S2 as further described below.

Another TGM circuit 226 has a first input terminal 228 coupled to receive operand bit $Y_{n-1}$ and a second input terminal 230 coupled to receive a complement of the operand bit $Y_{n-1}^*$. First and second control terminals 232,234 are coupled to receive operand bit $Y_n$ and its complement, respectively. Finally, an output terminal 236 is coupled through an inverter 238 to provide the first Booth select bit S1.

In the two-stage TGM binary tree structure 220-224, the first stage has control terminals 240,242 coupled to receive operand bit $Y_n$ and its complement, respectively, and an output terminal 244 coupled through an inverter 246 to provide the second Booth recode bit S2.

The first stage 220,222 has control terminals 248,250 coupled to receive operand bits $Y_{n-1}$ and its complement, respectively. The four input terminals to the second stage are numbered and connected as follows:

| | |
|---|---|
| 252 | $Y_{n+1}$ |
| 254 | LOGIC HIGH (+5) |
| 256 | LOGIC HIGH (+5) |
| 258 | $(Y_{n+1})^*$ | k bit and reduced sign bit

Figure 13:
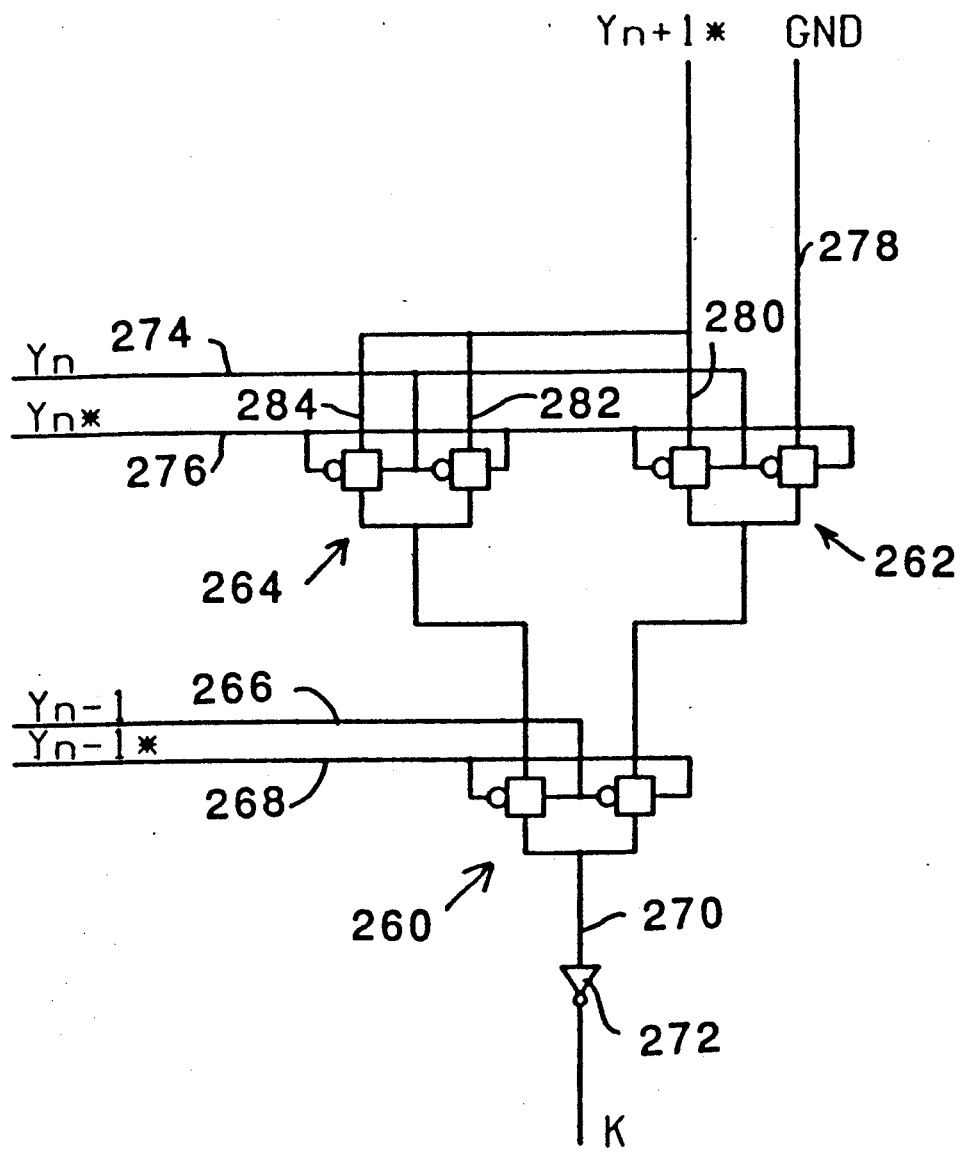
FIG. 13 is a schematic diagram of a constant K-bit circuit implemented in transmission gate logic.

FIG. 13 is a schematic diagram of a transmission gate multiplexer (TGM) constant K-bit circuit. Booth recoding yields a correct partial product if it requires the multiplicand to be added. But, when the multiplicand is required to be zero or subtracted, then the partial product is "one-complement". In that case, a constant 1 (K bit) is generated, as in the equation below:

$$K = \overline{Y_{n+1} \cdot (Y_n \cdot Y_{n-1})}$$

To implement this logic function, the circuit of FIG. 13 includes a two-stage TGM binary tree circuit. The first stage TGM 260 has control terminals 266,268 coupled to receive operand bit $Y_{n-1}$ and its complement, respectively. An output terminal 270 is coupled to an inverter 272 to provide the K bit signal.

The second stage TGMs 262,264 have control terminals 274, 276 coupled to receive operand bits $Y_n$ and its complement, respectively. Input terminals 280,282 and 284 are coupled to receive a complement of operand bit $Y_{n+1}$. Input terminal 278 is coupled to a logic LOW signal. In operation, one of said logic LOW and the complement of $Y_{n+1}$ bits is routed to the output terminal in accordance with the state of operand bits $Y_n$ and $Y_{n-1}$.

Figure 14:
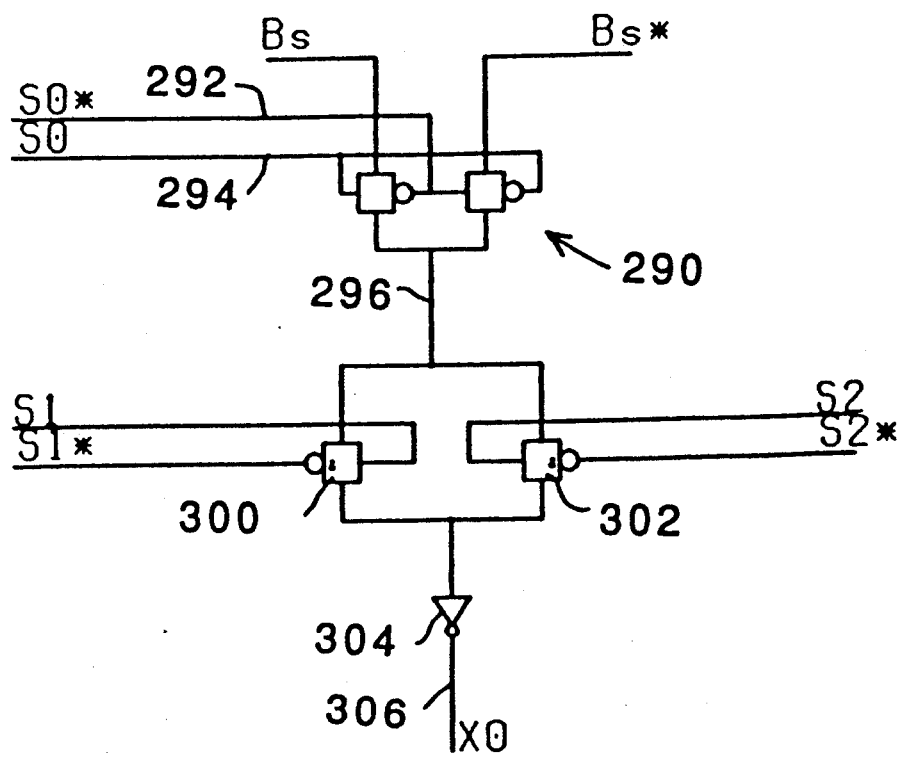
FIG. 14 is a schematic diagram of a reduced sign bit circuit implemented in transmission gate logic.

FIG. 14 is a schematic diagram of a transmission gate multiplexer (TGM) reduced sign-bit circuit. In Booth's algorithm, the sign bit of each running partial product is extended to the full word length before these partial products can be added together. Here, two extra bits are provided in front of each partial product to reduce these extended bits, as shown in Table 5 below:

TABLE 5

Extra Bits Truth Table

| RECODE SELECT | | | EXTRA BIT | |
|---|---|---|---|---|
| S0 | S1 | S2 | X1 | X0 |
| X | 0 | 0 | 1 | 0 |
| 1 | 1 | 0 | 1 | $B_s$ |
| 1 | 1 | 0 | 1 | $B_s$ |
| 1 | 0 | 1 | 1 | $B_s$ |
| 0 | 0 | 1 | 1 | $B_s$ |
| 0 | 1 | 0 | 1 | $B_s$ |
| 0 | 1 | 0 | 1 | $B_s$ |
| X | 0 | 0 | 1 | 0 |

Where d = don't care and
$B_s$ = multiplicand sign bit

To implement the foregoing logic functions, the circuit of FIG. 14 includes a TGM circuit 290 having first and second inputs coupled to receive multiplicand sign bit $B_s$ and its complement, $B_s^*$, respectively, and control inputs 292,294 coupled to receive S0 and its complement, $S_0^*$, respectively, and an output terminal 296.

A first transmission gate switch 300 is responsive to recode select bit S1 and connected between the TGM output terminal 296 and an inverter 304. A second transmission gate switch 302 is responsive to recode select bit S2 and connected in parallel to the first switch 300 between the TGM output terminal 296 and inverter 304. In operation, a logic signal at the inverter output terminal 306 provides the reduced sign-bit $X_0$.

Carry Select Adder (CSA)

Figure 15:
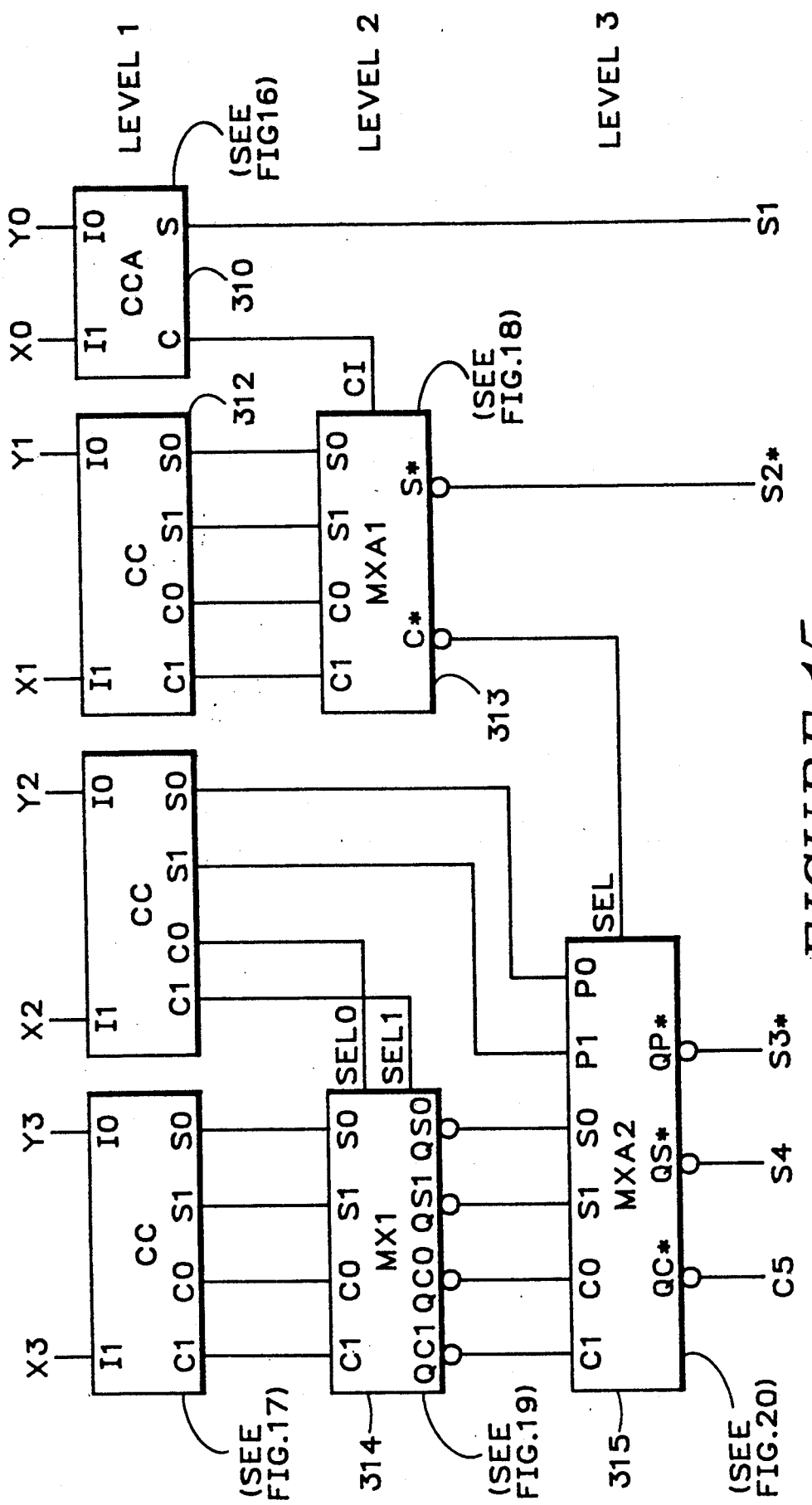
FIG. 15 is a block diagram of a 4-bit carry select adder.

Referring now to FIG. 15, a functional block diagram is shown of a 4-bit CSA adder circuit. Each of the circuits represented by a block in FIG. 15 is implemented in TGM logic, as described below. Each of function blocks 310,312,313,314 and 315 is described in detail below with reference to a corresponding figure, each respectively indicated in FIG. 15. The following section describes the implementation for 4-bit Carry Select Adder (CSA).

The 4-bit CSA is constructed with these elements: CCA, CC, MXA1, MX1, and MXA2. Following are the definitions for these elements of the CSA:

CCA: 1st level of CSA for 1.bit adder w/ carry in = "0"

CC: 1st level of CSA for 1.bit adder w/ assumption carry in both "1" and "0"

MXA1: Selection for sum and carry that depends on carry in (2nd level of CSA)

MX1: Selection for sum and carry that assumes carry in is both "0" and "1" (2nd level of CSA)

MXA2: Selection for sum and carry that depends on carry in (3rd level of CSA)

For larger than 4-bit CSA implementations, CCA and CC are the same, but additional MXA3, MXA4, MXA5, MXA6 ... and MX2, MX3, MX4, MX5 ... are needed. MXA3, MXA4, MXA5, and MXA6 are logically the same as MXA2; and MX2, MX3, MX4 ... are logically the same as MX1 but wider to accommodate more bits.

Figure 16:
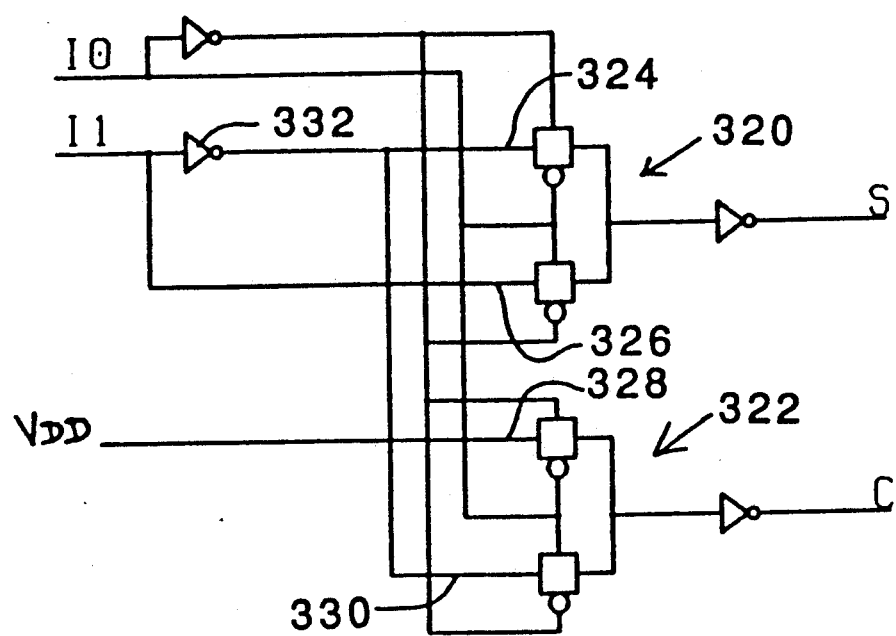
FIG. 16 is a schematic diagram of a CCA (first-level CSA) circuit, implemented in transmission gate logic.

The CCA block 310 is detailed in FIG. 16. Referring to FIG. 16, the circuit 310 comprises a TGM first-level carry-select adder (CSA) circuit for combining operand bits $X_0$ and $Y_0$ provided to input terminals I0 and I1 to form a sum bit S and a carry bit C. The circuit includes a first TGM circuit 320 and a second TGM circuit 322. Both TGM circuits 320,322 are controlled by the signal at input terminal $I_0$. TGM input terminals 324 and 330 are coupled to input terminal I1 through an inverter 332. TGM input terminal 326 is coupled to input terminal I1, and TGM input terminal 328 is coupled to a logic HIGH signal.

Figure 17:
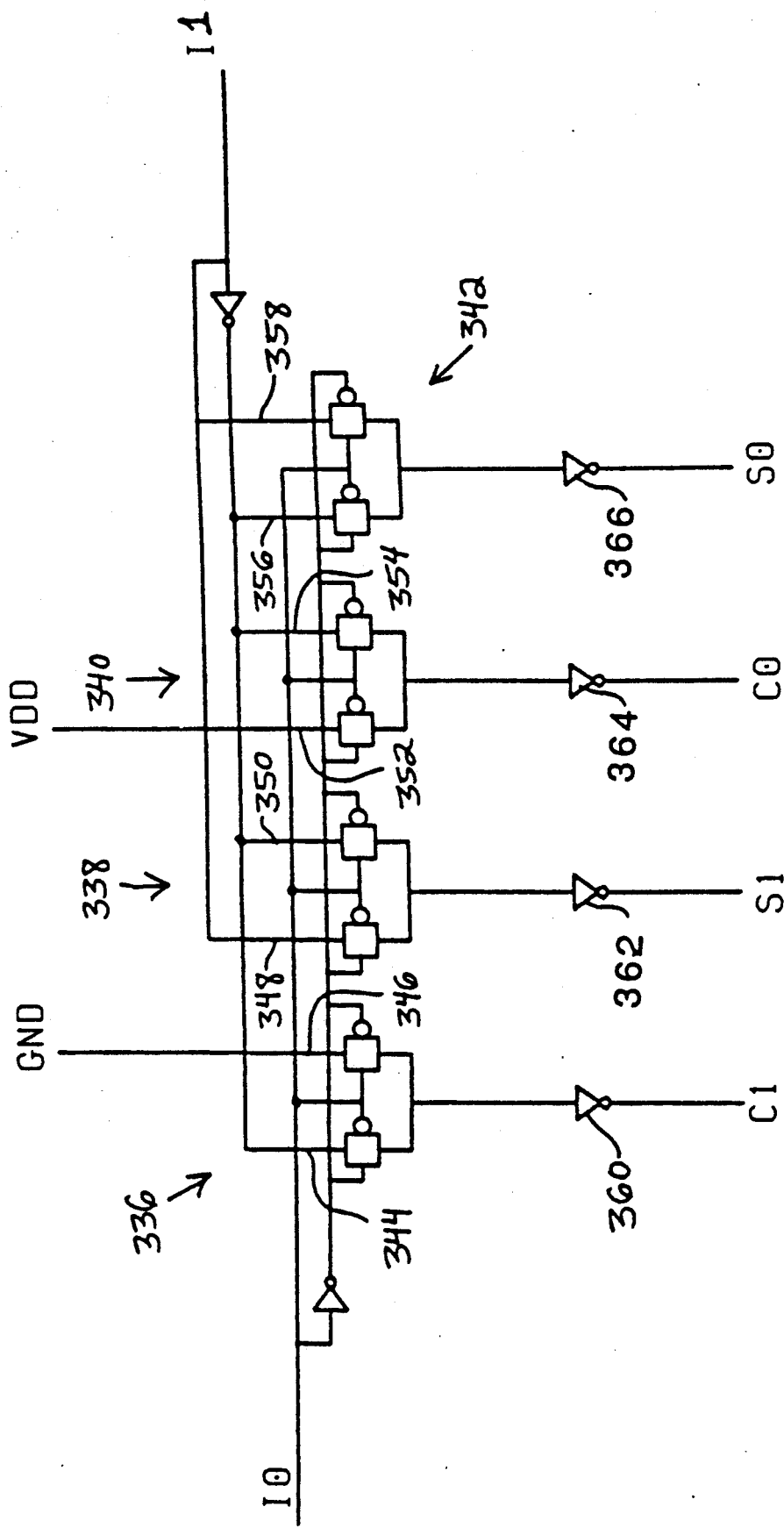
FIG. 17 is a schematic diagram of a CC (first-level CSA) circuit implemented in transmission gate logic.

FIG. 17 is a schematic diagram of a TGM first-level carry-select adder circuit ("CC") for combining operand bits $X_0$ and $Y_0$ present at inputs 10 and 11 to form intermediate sum bits S0 and S1 and to form intermediate carry bits C0 and C1. The circuit comprises four TGM circuits 336,338,340 and 342, each having control terminals coupled to I0 and its complement. The TGM input terminals are connected as follows:

| 344 | $I_1^*$ |
| 346 | logic LOW |
| 348 | $i_1$ |
| 350 | $I_1$ |
| 352 | logic HIGH |
| 354 | $I_1$ |
| 356 | $I_1^*$ |
| 358 | $I_1$ |

The output of TGM 336 is coupled to an inverter 360 to provide carry signal $C_1$. The output of TGM 338 is coupled to an inverter 362 to provide sum signal $s_1$. The output of TGM 340 is coupled to an inverter 364 to provide carry signal $C_0$. Finally, the output of TGM 342 is coupled to an inverter 366 to provide sum signal $S_0$.

Figure 18:
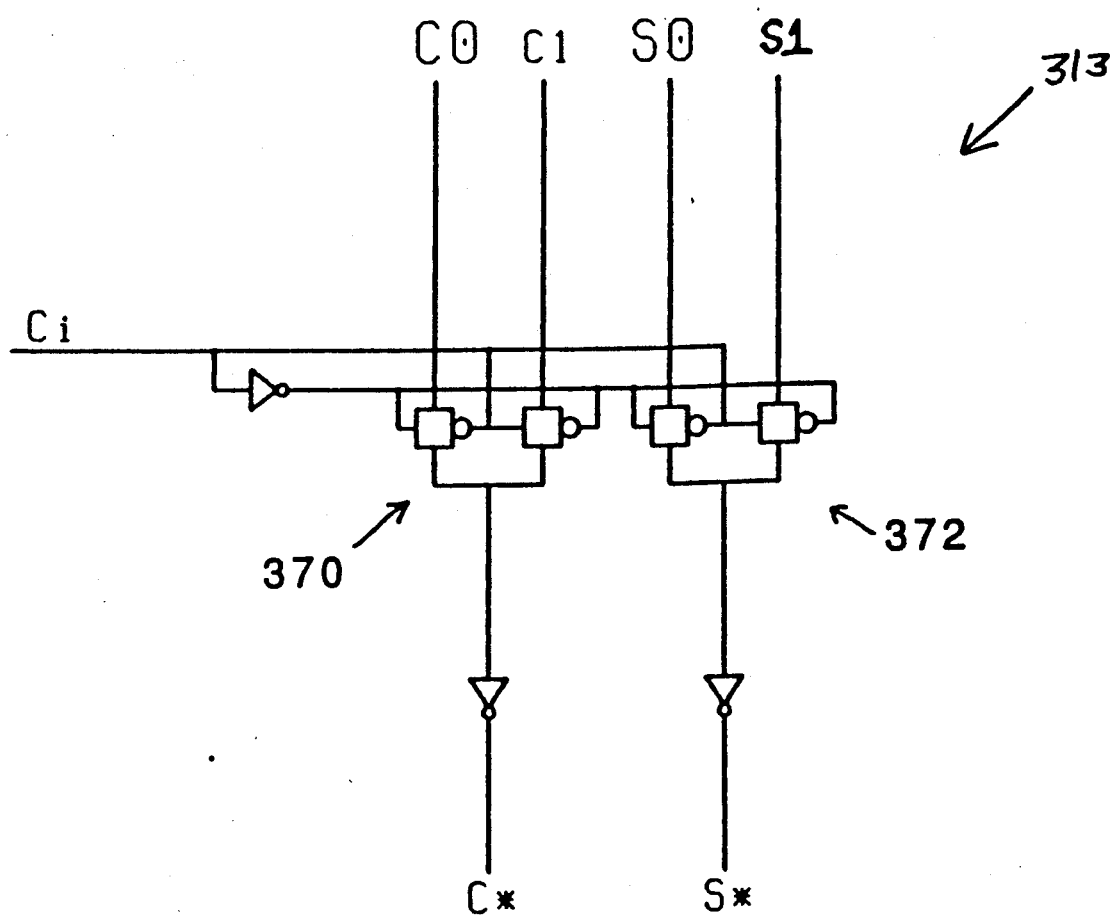
FIG. 18 is a schematic diagram of an MXA1 (second-level CSA) circuit implemented in transmission gate logic.

FIG. 18 is a schematic diagram of the "MXA1" circuit 313 (FIG. 15). This TGM circuit is a second-level, least significant position, carry-select adder circuit for selecting either sum and carry bits S0 and C0 or alternative sum and carry bits S1 and C1, depending on the state of a control input terminal $C_I$. The $C_I$ input terminal is coupled to receive the carry output signal C from the CCA circuit of FIG. 16.

The circuit of FIG. 18 includes a pair of TGM circuits 370,372 both having control terminals coupled to the control bit $C_I$. The inputs of the two TGMs are coupled to receive input signals S0, S1, C0 and C1 as shown.

Figure 19:
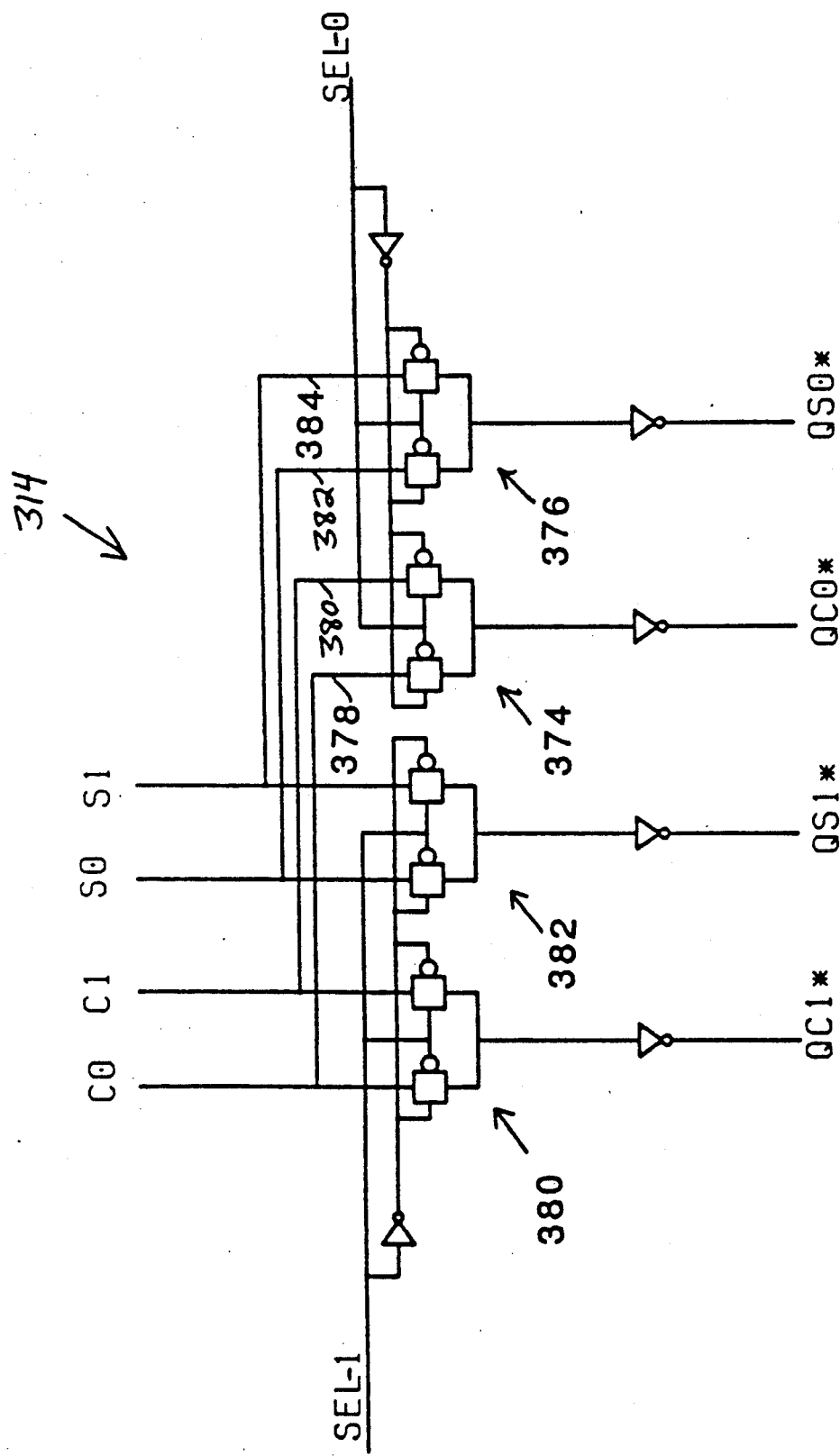
FIG. 19 is a schematic diagram of an MX1 (second-level CSA) circuit implemented in transmission gate logic.
Figure 20:
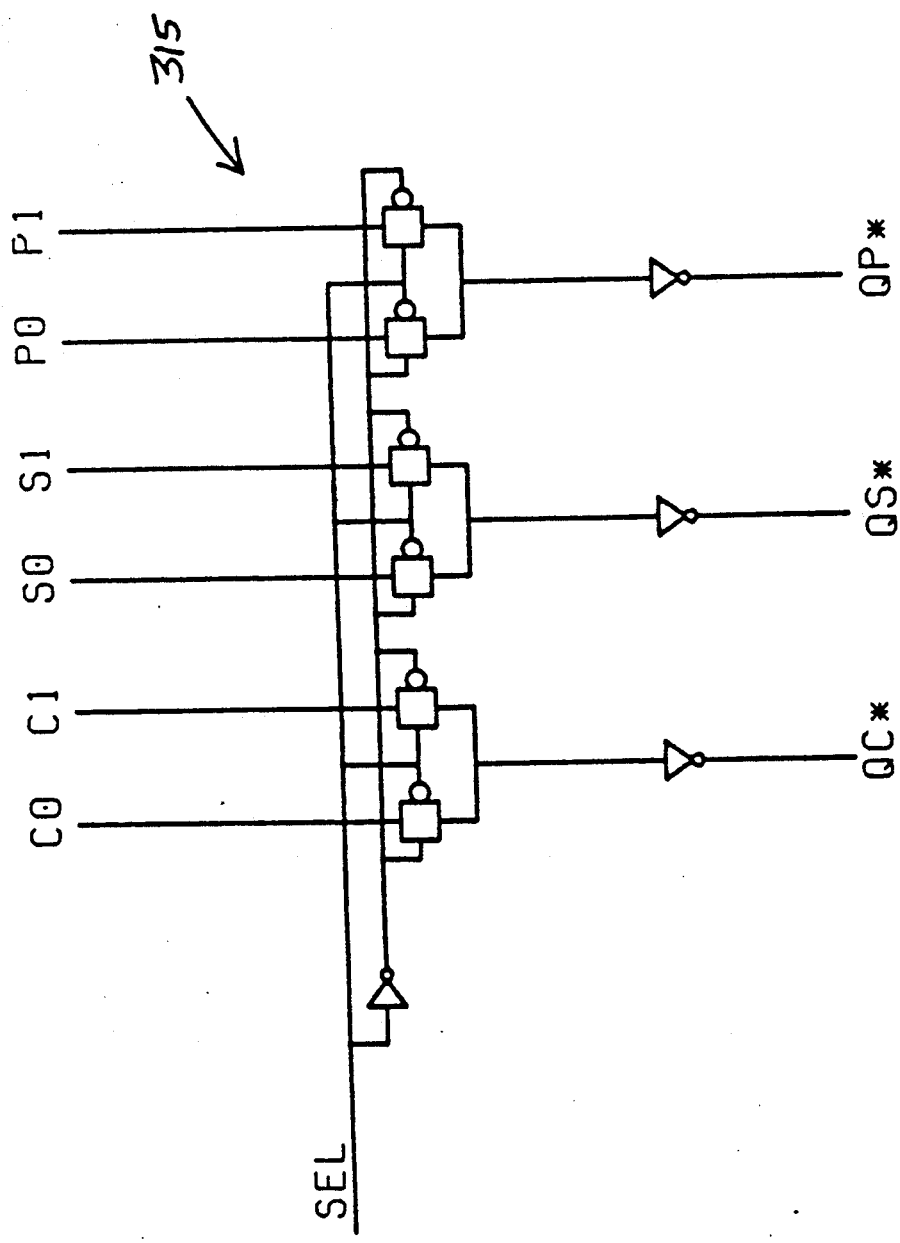
FIG. 20 is a schematic diagram of an MXA2 (second-level) circuit implemented in transmission gate logic.

FIG. 19 is a schematic diagram of an "MX1" circuit 314 (FIG. 15). It includes a first pair Of TGMs 374, 376 both having control terminals coupled to a select input terminal SEL-0. TGM 374 has input terminals coupled to carry bits C0 and C1 to provide at its output terminal QC0. TGM 376 has input terminals coupled to sum bits S0 and S1 to provide at its output terminal QS0. The circuit of FIG. 19 further includes a second pair of TGM circuits 380, 382, both having control terminals coupled to a SEL-1 input terminal for providing the QC1 and QS1 output signals. The input terminals to TGMs 380, 382 are connected to C0, C1, S0 and S1 as described above. Referring now to FIG. 20, the "MXA2" circuit 315 (FIG. 15) is shown. This is a TGM third-level carry-select adder circuit for selecting sum and carry signals that depends on the state of a carry-in signal applied to a select input terminal SEL. The logic is equivalent to that shown in FIG. 18 (MXA1), except that MXA2 is one bit wider for implementing level three of the CSA adder of FIG. 15.

Multiplier and Multiplier-Accumulator Circuits

Figure 21:
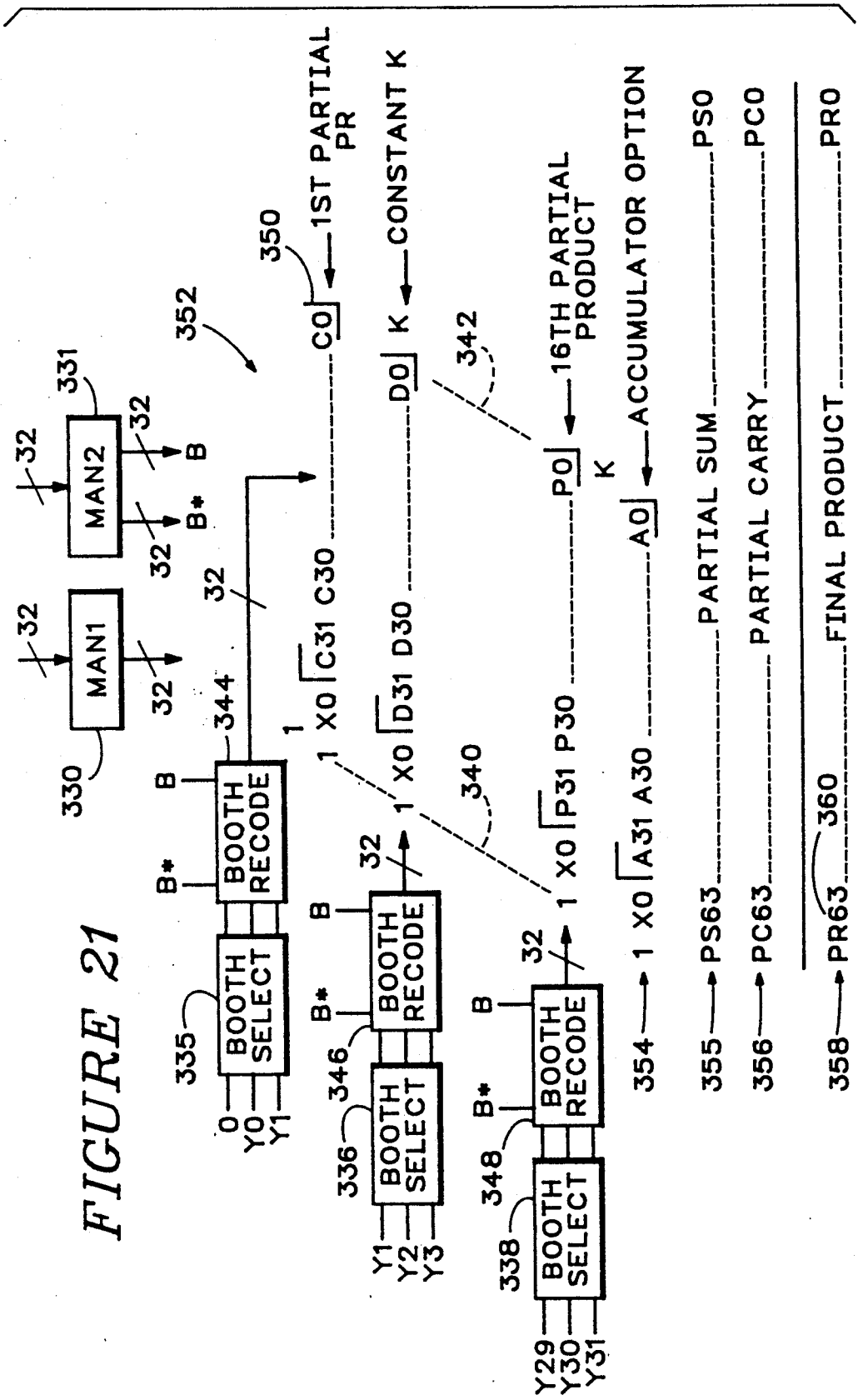
FIG. 21 is a block diagram of a 32-bit multiplier circuit for implementation in transmission gate logic.

FIG. 21 is a functional block diagram of a 32-bit multiplier circuit. The multiplier circuit includes input latches or registers 330, 331 for receiving a 32-bit multiplier Y and a 32-bit multiplicand B. Sequential groups of three multiplier bits with one bit overlap, for example $Y_1 Y_2 Y_3$, are coupled to booth select logic 335, 336 and 338 as is known. (The first group includes a fixed logic 0 ($0 Y_0 Y_1$).) As indicated by dashed lines 340, 342, only three Booth select logic circuits are illustrated of the 16 such circuits which are required.

Each Booth select circuit is coupled to a corresponding Booth recode circuit 344, 346, 348 to recode the multiplicand and thereby form a corresponding partial product term, such as the first partial product term 350. The partial product terms, including reduced sign bits, are combined and compressed in a Dadda tree circuit 352 (shown only conceptually), which operates as follows.

A Dadda tree adder is a set of carry-save adders which add up the partial products, and produce the partial sum and partial carry bits. Consider the series: 2; 3; 4; 6; 9; 13; 19 ... where each term is obtained from the preceding term by multiplying it by 3/2 and taking the integer part. A multiplier matrix with n rows can be transformed into a new matrix having the number of rows coinciding with the nearest term of the above series, which is less than n. The new matrix is then transformed to another matrix having a number of rows that coincides with the next smaller term of the series. This process is repeated until a 2-row matrix is obtained. During such a transformation, any column of an "old" matrix having a number of bits less than the number of rows of the "new" matrix will be reproduced without transformation. In the circuit shown, the Dadda tree comprises six levels of full adders, to form the partial sum and partial carry terms Optionally, an accumulator term $AC_0$ --- $AC_{31}$ (plus reduced sign bits $X_0$,1) 354 may be included in the Dadda tree circuitry, as a 17th partial product, to implement a multiplier-accumulator function. Finally, a partial sum term 355 and a partial carry term 356 are combined in an adder (see FIG. 22) to form a final product 358, in which the most significant position PR63 is the sign bit 360. For a 32-bit multiplier, seven levels of carry-select adders are required to combine the partial sum and partial carry terms to form the final product.

According to the present invention, one or more of the subcircuits that form the multiplier circuit are constructed using TGMs and inverters as discussed above. Candidate subcircuits include the Booth select circuit (see FIG. 12), the Booth recode mux (see FIG. 11), constant K-bit circuit (see FIG. 13), reduced sign bit circuit (see FIG. 14), carry-select adder circuits (see FIGS. 15-20). The Dadda tree circuitry 352 comprises full adder and half adder circuits (see FIGS. 7,8).

Figure 22:
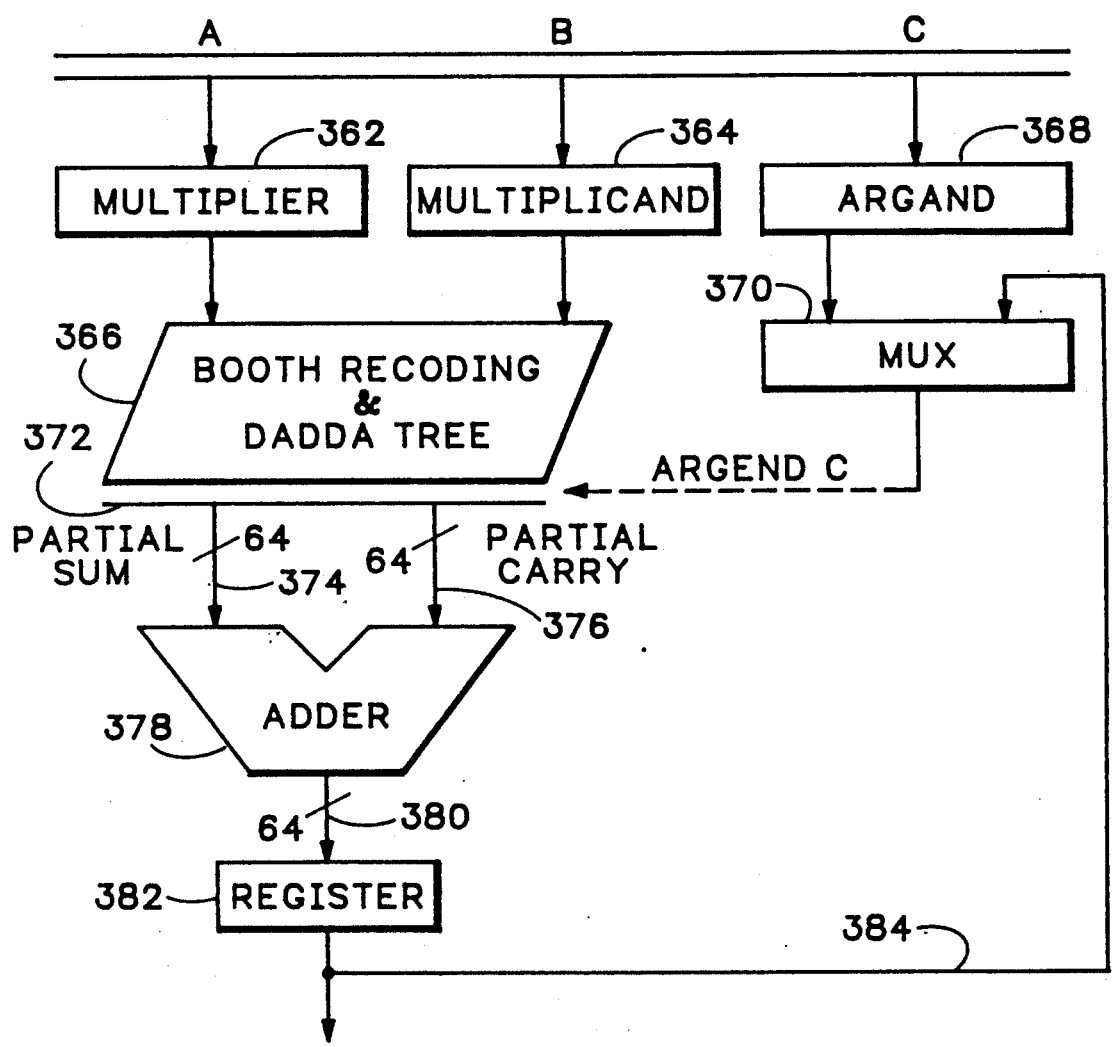
FIG. 22 is a block diagram of a multiplier-accumulator (MAC) circuit.

FIG. 22 is a block diagram of a multiplier-accumulator (MAC) circuit. The MAC circuit includes registers 362, 364 for receiving A multiplier and B multiplicand operands, respectively. The A and B operands are input to Booth recoding and Dadda tree circuitry 366 such as that described above. Partial sum and partial carry terms are provided over paths 74, 376 respectively to an adder 378. The adder 378 combines the partial sum and carry terms to provide a final result over path 380 to an output register 382.

An additional input register 368 receives an augend operand C. Augend C is provided to one input of a multiplexer (mux) 370. The other input to mux 370 is coupled to output register 382 along a path 384. In operation, mux 370 selects the contents of either register 382 or register 368 to become an augend term 372. The selected augend term is coupled into the Dadda Tree circuitry 366, for example as shown in FIG. 21, so that the augend term is summed along with, and just as if it were one of, the conventional partial product terms generated by the multiplier circuitry. This has the advantage of summing the augend term without having to wait for calculation of the final product of the A and b operands to be completed.

Addition of the partial sum and partial carry terms to form the final product of A and B is time consuming. To add the augend to the final product as is done in the prior art requires an additional 67-bit adder and the associated delay. The MAC circuit of the present invention thus reduces the necessary circuitry by a 67-bit adder, while providing in a MAC the performance of a 32-bit multiplier.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A transmission gate multiplexer (TGM) Booth select circuit for combining a series of three operand bits, $Y_{n-1} Y_n$ and $Y_{n+1}$ to form a Booth recoded pair of bits S1,S2, the circuit comprising:
    a TGM having a first input terminal coupled to receive operand bit $Y_{n-1}$, a second input terminal coupled to receive a complement of the operand bit $Y_{n-1}$, a control terminal coupled to receive operand bit $Y_n$ and an output terminal to provide the first Booth recode bit S1; and
    a two-stage TGM binary tree circuit, the first stage having a control terminal coupled to receive operand bit $Y_n$ and an output terminal to provide the second Booth recode bit S2;
    the second stage having a control terminal coupled to receive operand bit $Y_{n-1}$ and having first, second, third and fourth input terminals;
    the first input terminal coupled to receive a complement of operand bit $Y_{n+1}$;
    the second and third input terminals coupled to receive a logic HIGH signal; and
    the fourth input terminal coupled to receive operand bit $Y_{n+1}$.

2. A transmission gate multiplexer (TGM) Booth recode multiplexer circuit for selecting one of a next less significant bit (next LSB), a multiplicand bit (+Mcand) and a complement multiplicand bit (−Mcand) to form a Z result signal in accordance with Booth select bits S0, S1 and S2, the recode multiplexer circuit comprising:
    a TGM circuit having a first input terminal coupled to receive the −Mcand bit, a second input terminal coupled to receive the +Mcand bit, a control terminal coupled to receive the S0 select bit, and an output terminal to provide an output signal;
    a first transmission gate switch coupled to the output terminal of the TGM circuit and responsive to the S1 select bit for selectively coupling the output signal to a node defining a common node; and
    a second transmission gate switch coupled to receive the next least significant bit (LSB) and responsive to the S2 select bit for selectively coupling the next LSB to the common node.

3. A transmission gate multiplexer (TGM) constant K-bit circuit for combining operand bits $Y_{n-1}$, $Y_n$ and $Y_{n+1}$ to form a K bit comprising:
    a two-stage TGM binary tree circuit having first, second, third and fourth input terminals, first stage and second stage control terminals and an output terminal;
    the first stage control terminal being coupled to receive operand bit $Y_{n-1}$;
    the second stage control terminal being coupled to receive operand bit $Y_n$;
    the first input terminal being coupled to receive a logic LOW signal; and
    the second, third and forth input terminals being coupled to receive a complement of operand bit $Y_{n+1}$ so that the output terminal provides the K-bit.

4. A transmission gate multiplexer (TGM) reduced sign bit circuit for combining recode select bits S0, S1 and S2 and a multiplicand sign bit $B_s$ to form a reduced sign bit $X_0$ comprising:
    a TGM circuit having first and second input terminals coupled to receive $B_s$ and its complement, respectively, a control input terminal coupled to receive S0 and an output terminal;
    an inverter having an input terminal and an output terminal;
    a first transmission gate switch, responsive to S1 and connected between the TGM output terminal and the inverter input terminal; and
    a second transmission gate switch, responsive to S2 and connected in parallel to the first switch between the TGM output terminal and the inverter input terminal; so that, in operation, a logic signal at the inverter output terminal defines the reduced sign bit $X_0$.

* * * * *

UNITED STATES PATENT AND TRADEMARK OFFICE
CERTIFICATE OF CORRECTION

PATENT NO. : 5,040,139
DATED     : August 13, 1991
INVENTOR(S) : Joseph Tran

It is certified that error appears in the above-identified patent and that said Letters Patent is hereby corrected as shown below:

Column 7     line 65, change "of 13 inverters" to --of 13 inverters-- ("13" should not be in bold print);

Column 11    line 26, change "10 and 11" to --IO and I1--;

Column 13    line 9, change "paths 74," to --paths 374,--.

Signed and Sealed this

Sixth Day of April, 1993

Attest:

STEPHEN G. KUNIN

Attesting Officer          Acting Commissioner of Patents and Trademarks